United States Patent
Tsai et al.

(10) Patent No.: US 10,297,337 B2
(45) Date of Patent: May 21, 2019

(54) HIERARCHICAL FAIL BIT COUNTING CIRCUIT IN MEMORY DEVICE

(71) Applicant: SanDisk Technologies LLC, Plano, TX (US)

(72) Inventors: Wanfang Tsai, Palo Alto, CA (US); Hung-Szu Lin, Fremont, CA (US); Yi-Fang Chen, Milpitas, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/669,739

(22) Filed: Aug. 4, 2017

(65) Prior Publication Data

US 2019/0043603 A1    Feb. 7, 2019

(51) Int. Cl.
  *G11C 29/44*    (2006.01)
  *H03K 23/40*    (2006.01)

(52) U.S. Cl.
  CPC ............ *G11C 29/44* (2013.01); *H03K 23/40* (2013.01)

(58) Field of Classification Search
  CPC ................................ G11C 29/44; H03K 23/40
  USPC ....................................................... 365/200
  See application file for complete search history.

(56) References Cited

U.S. PATENT DOCUMENTS

| 7,225,374 | B2 | 5/2007 | Burdline et al. |
| 8,427,884 | B2 | 4/2013 | Liu et al. |
| 8,681,548 | B2 | 3/2014 | Liu et al. |
| 8,842,473 | B2 | 9/2014 | Tsai |
| 8,897,080 | B2 | 11/2014 | Tsai |
| 2012/0250411 | A1* | 10/2012 | Abiko ............ G11C 16/26 365/185.09 |
| 2012/0314504 | A1* | 12/2012 | Komai ............ G11C 16/06 365/185.22 |
| 2012/0321032 | A1* | 12/2012 | Liu ............ G11C 29/44 377/26 |
| 2016/0328332 | A1 | 11/2016 | Zaitsu et al. |
| 2017/0115342 | A1* | 4/2017 | Wang ............ G11C 16/0483 |

* cited by examiner

*Primary Examiner* — Anthan Tran
(74) *Attorney, Agent, or Firm* — Vierra Magen Marcus LLP

(57) ABSTRACT

Apparatuses and techniques for counting 0 or 1 bits in a set of bits using both serial and parallel processes. The counting process includes a hierarchy in which the count from different parallel processes at one level in the hierarchy are passed to a smaller number of different parallel processes at a lower level in the hierarchy. A final count is obtained by an accumulator below the lowest level of the hierarchy. The position and configuration of the circuits can be set to equalize a number of circuits which process the different bits, so that a maximum delay relative to the accumulator is equalized.

12 Claims, 16 Drawing Sheets

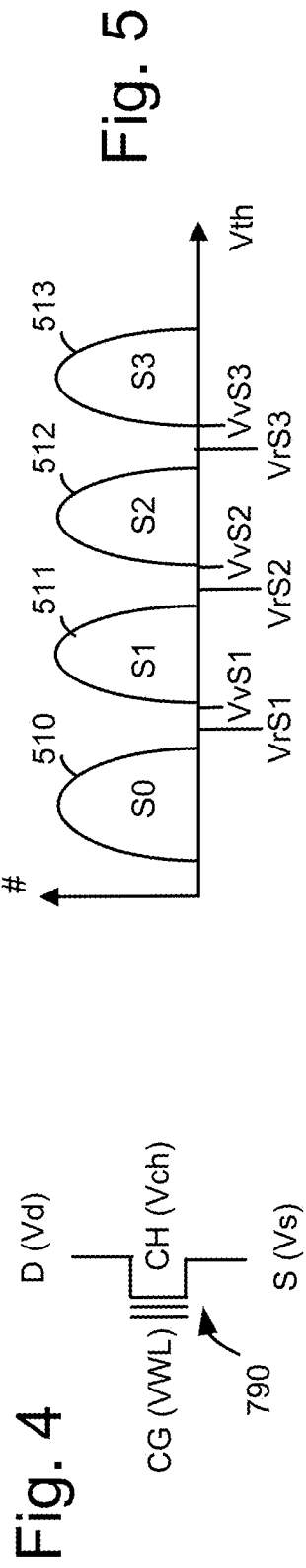
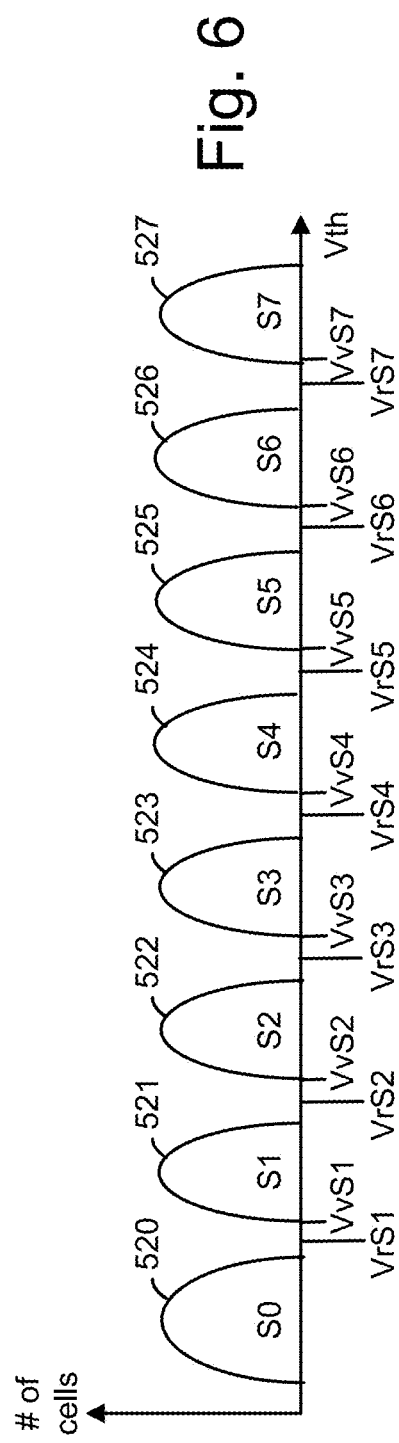

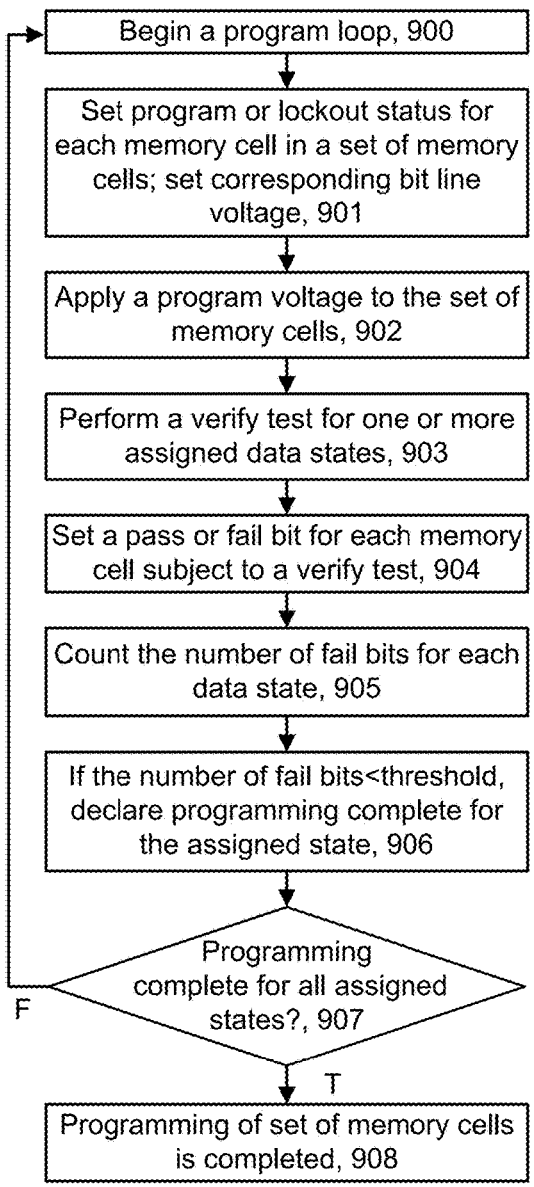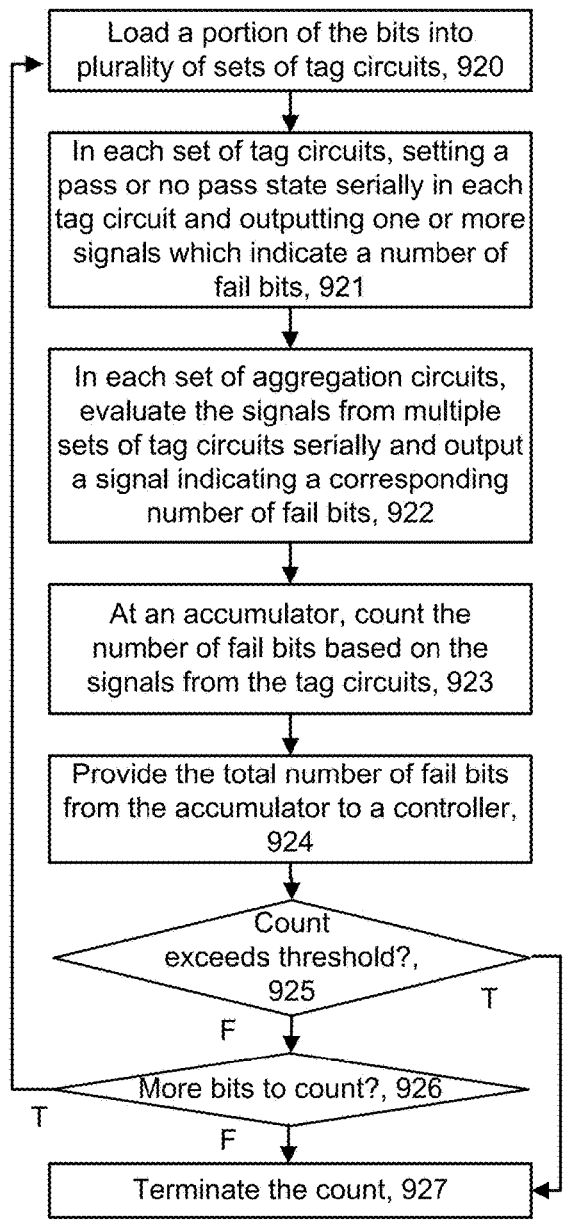

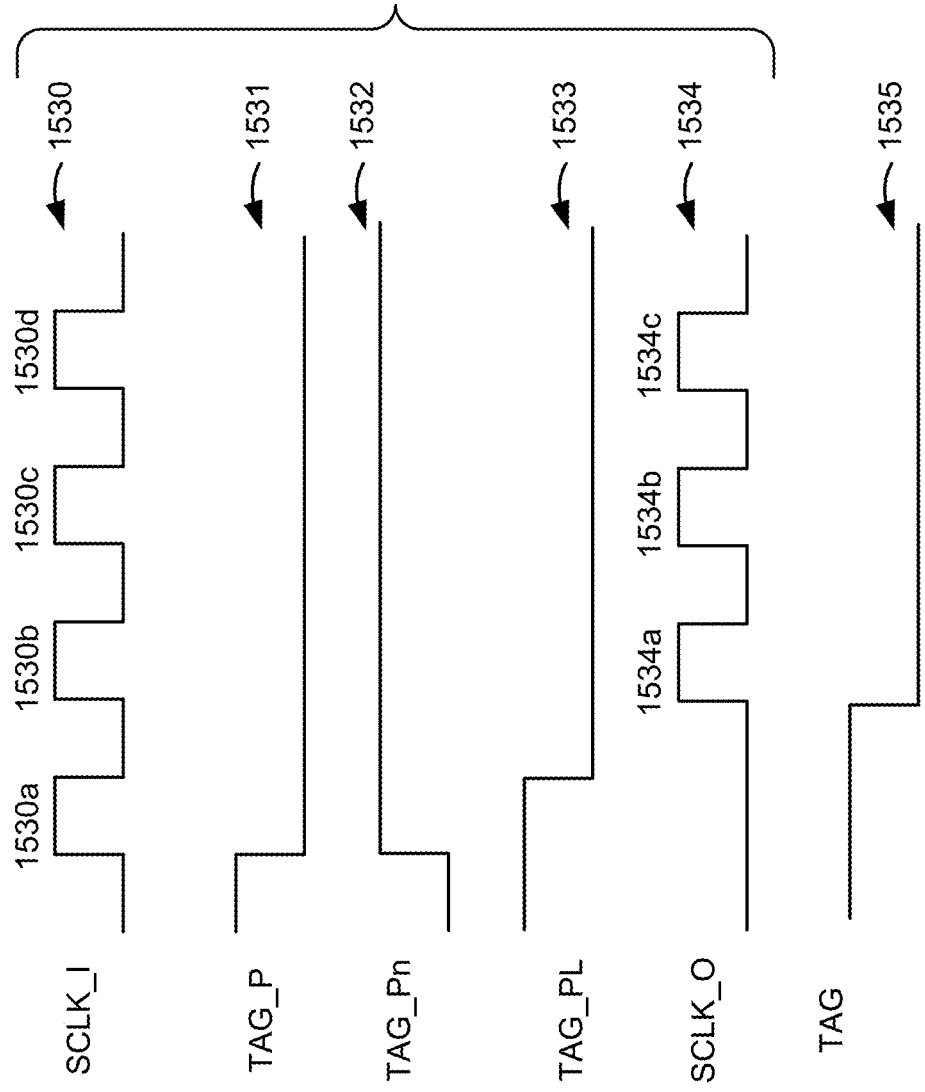

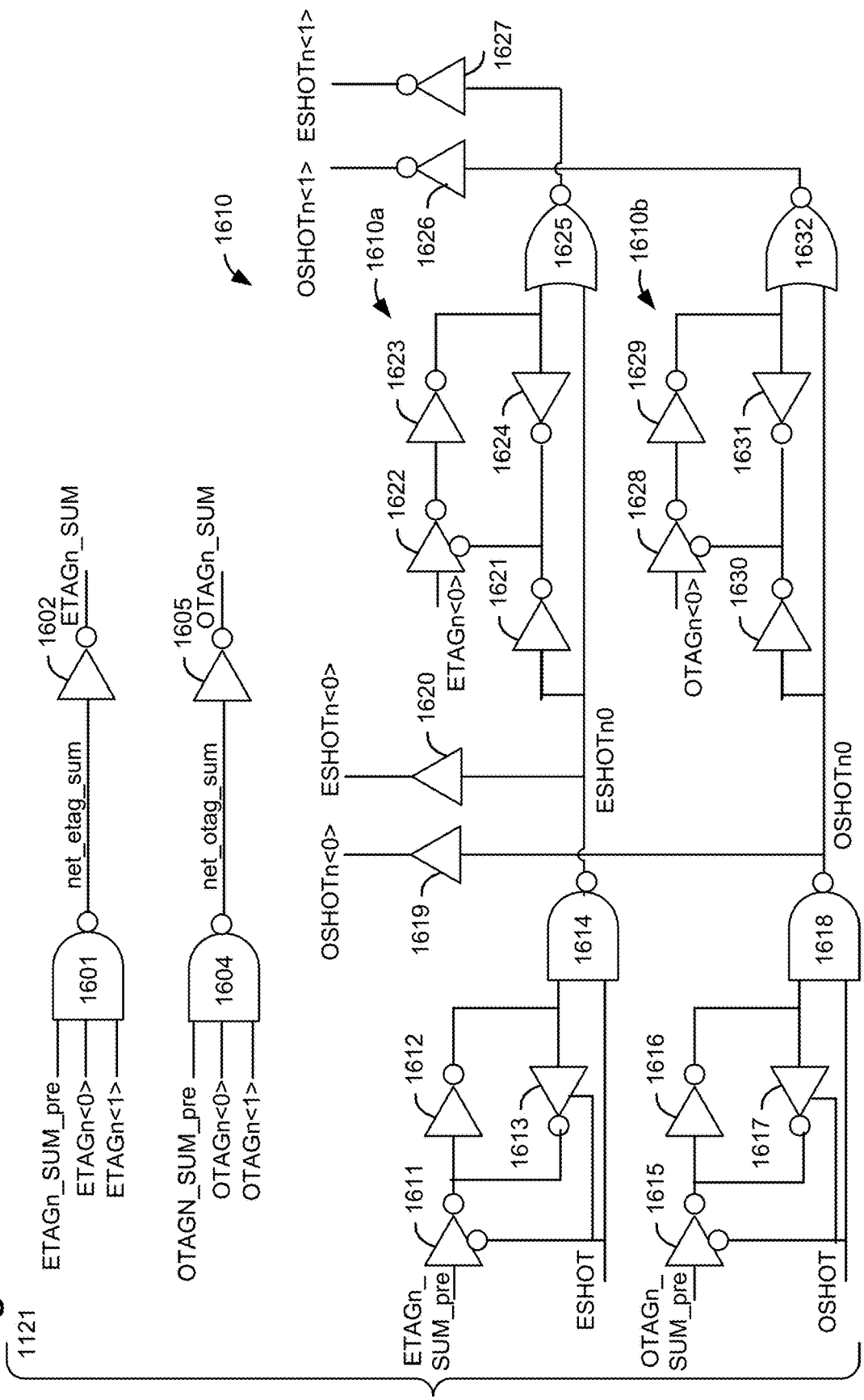

US 10,297,337 B2

HIERARCHICAL FAIL BIT COUNTING CIRCUIT IN MEMORY DEVICE

BACKGROUND

The present technology relates to a circuit for counting bits. A bit counting circuit can be used in a memory device or other type of circuit. For example, a bit counting circuit can be used to determine the programming progress in a memory device. A bit counting circuit may count the number of 0's and/or 1's in a bit string. However, various challenges are presented in operating such circuits.

BRIEF DESCRIPTION OF THE DRAWINGS

FIG. 4 depicts an example memory cell.

FIG. 5 depicts an example Vth distribution of memory cells, where four data states are used.

FIG. 6 depicts an example Vth distribution of memory cells, where eight data states are used.

FIG. 9A depicts a flowchart of an example programming operation in which fail bits are counted.

FIG. 9B depicts a flowchart of an example bit counting process which implements step 905 of FIG. 9A.

FIG. 9C depicts a flowchart of an example bit counting process which implements step 922 of FIG. 9B.

FIG. 15B depicts example waveforms associated with the circuit of FIG. 15A.

FIG. 16 depicts an example implementation of the aggregation circuit 1121 of FIG. 11.

DETAILED DESCRIPTION

Figure 1:
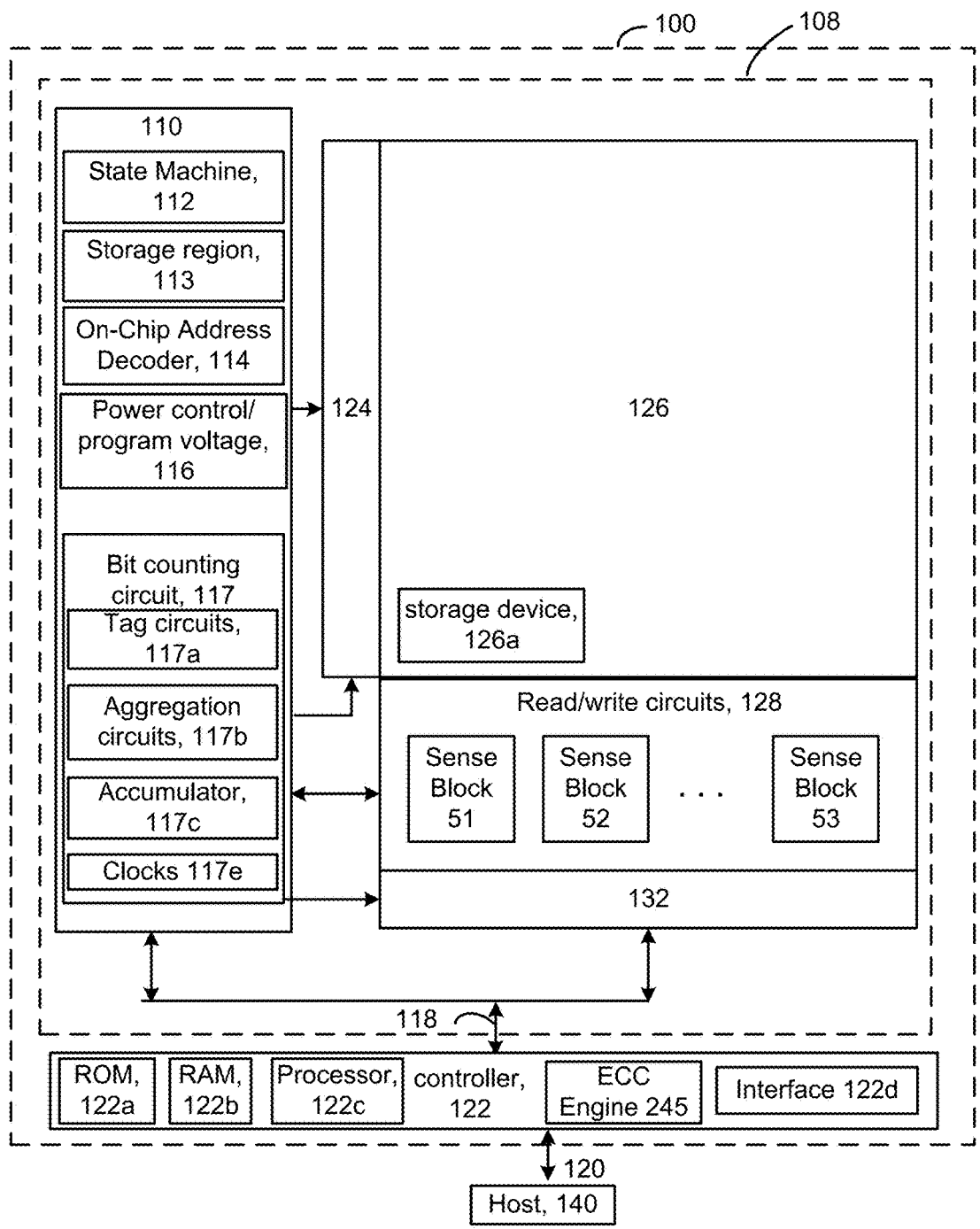
FIG. 1 is a block diagram of an example memory device.

Apparatuses and techniques are described for counting 0 or 1 bits in a set of bits.

An example implementation involves counting bits during a programming operation in a memory device. For example, semiconductor memory devices have become more popular for use in various electronic devices such as cellular telephones, digital cameras, personal digital assistants, mobile computing devices, non-mobile computing devices and other devices.

Various types of non-volatile memory cells can be used in such memory devices. In one approach, a charge-storing material such as a floating gate or a charge-trapping material can be used in a memory cell to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers. In another approach, a memory cell comprises a resistance-switching material. Other types of non-volatile memory cells can be used as well. Many applications exists for volatile memory devices as well.

In such devices and other circuits, there may be a need to count the number of logic 0's or 1's in an N-bit string. In one example, during a programming operation, multiple program loops may be performed until the programming is completed. During each program loop, a program voltage is applied, followed by one or more verify tests. Each verify test involves sensing the memory cells to determine if their threshold voltages exceed a verify voltage which is associated with an assigned data state. When all or most of the memory cells having a particular assigned data state pass the verify test for that state, the programming to that state has been completed. This informs the control that it is no longer necessary to spend time performing a verify test for that data state in subsequent program loops. Also, when the verify tests for all assigned data states are passed, this informs the control that the programming operation has successfully completed.

During the verify test, the sensing circuits associated with the memory cells may output a bit indicting whether or not the cell has reached the assigned data state. For example, a 1 may indicate the assigned data state has been reached and a 0 may indicate the assigned data state has not been reached. The 1 bit may be referred to as a pass bit while the 0 bit is a fail bit, in one approach. A counting circuit can count the number of fail bits and determine if the number is below a threshold of a success criterion, such as 1% of the cells of a given assigned data state.

In another example, a page of data is programmed into a set of memory cells and read back after the programming is completed. The read back data is then compared to the original write data which has been temporarily stored. For each memory cell, a 1 bit may indicate the read back state matches the write data and a 0 may indicate the read back state does not match the write data, e.g., an error has occurred. The number of 0's can be counted to obtain the total number of programming errors. If the total is at or below a threshold of correctable errors of an ECC decoding process, the programming is successful. If the total is above the threshold of correctable errors, the programming has failed. In this case, one option is to repeat the programming on the same set of memory cells. Another option is to declare the set of memory cells to be defective and perform the programming on another set of memory cells. Many other examples exist for counting the number of 0's or 1's in a set of bits.

However, counting the number of 0 or 1 bits can be time and hardware intensive. For example, in current memory devices, counting bits from a page of data may involve counting on the order of 10^5 bits.

Techniques provided herein address the above and other issues. In one approach, 0 or 1 bits are counted using both serial and parallel processes. Further, the counting processes can include a hierarchy in which the count from different parallel processes at one level in the hierarchy are passed to a smaller number of different parallel processes at a lower level in the hierarchy. A final count is obtained by an accumulator below the lowest level of the hierarchy. The position and configuration of the circuits can be set to equalize a number of circuits which process the different bits, so that a maximum delay relative to the accumulator is equalized or made more equal.

In one approach, in each parallel counting process, a number of tag circuits are arranged serially in a chain. Each tag circuit is loaded with a bit and the bit value determines whether a low or high signal is output from the chain. The output from the chain may have a high level for a fail bit and a low level for a pass bit, in one approach. The output from multiple chains is then fed to aggregation circuits. The aggregation circuits aggregate or gather the fail bit count information from the tag circuits and pass it to an accumulator which obtains a final count. The process may be repeated as additional bits are loaded into the tag circuits.

Various other features and benefits are described below.

FIG. 1 is a block diagram of an example memory device. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . , 53 (sensing circuitry) and allow a page of memory cells to be read or programmed in parallel. Further details of the sense blocks are provided further below. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126. The control circuitry can include a state machine 112, a storage region 113, an on-chip address decoder 114, a power control/program voltage module 116, and a bit counting circuit 117. The bit counting circuit may include tag circuits 117*a*, aggregation circuits 117*b* and an accumulator 117*c*. The aggregation circuits may be arranged in a hierarchy of two of more levels. The tag circuits each set a pass or no pass state based on whether a respective bit has a specified level of 0 or 1. A count of bits having the specified value is provided from the tag circuits to the aggregation circuits which, in turn, aggregate the counts and provide them to the accumulator. The accumulator, in turn, provide a total of the counts to a control. For example, the final count may represent the number of 0's or 1's in the set of bits being counted. The total time to count the bits can be reduced by using both serial and parallel processes. Further details are provided below.

The state machine 112 provides chip-level control of memory operations. The storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control/program voltage module 116 controls the power and voltages supplied to the word lines, select gate lines, bit lines and source lines during memory operations. It can include drivers for word lines, SGS and SGD transistors and source lines. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control/program voltage module 116, bit counting circuit 117, sense blocks 51, 52, . . . , 53, read/write circuits 128, controller 122, and so forth.

The off-chip controller 122 (which in one embodiment is an electrical circuit) may comprise a processor 122*c*, storage devices (memory) such as ROM 122*a* and RAM 122*b* and an error-correction code (ECC) engine 245. The ECC engine can correct a number of read errors.

A memory interface 122*d* may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122*d*.

The storage device comprises code such as a set of instructions, and the processor is operable to execute the set of instructions to provide the functionality described herein. Alternatively or additionally, the processor can access code from a storage device 126*a* of the memory structure, such as a reserved area of memory cells in one or more word lines.

For example, code can be used by the controller to access the memory structure such as for programming, read and erase operations. The code can also be used for bit counting. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Figure 2:
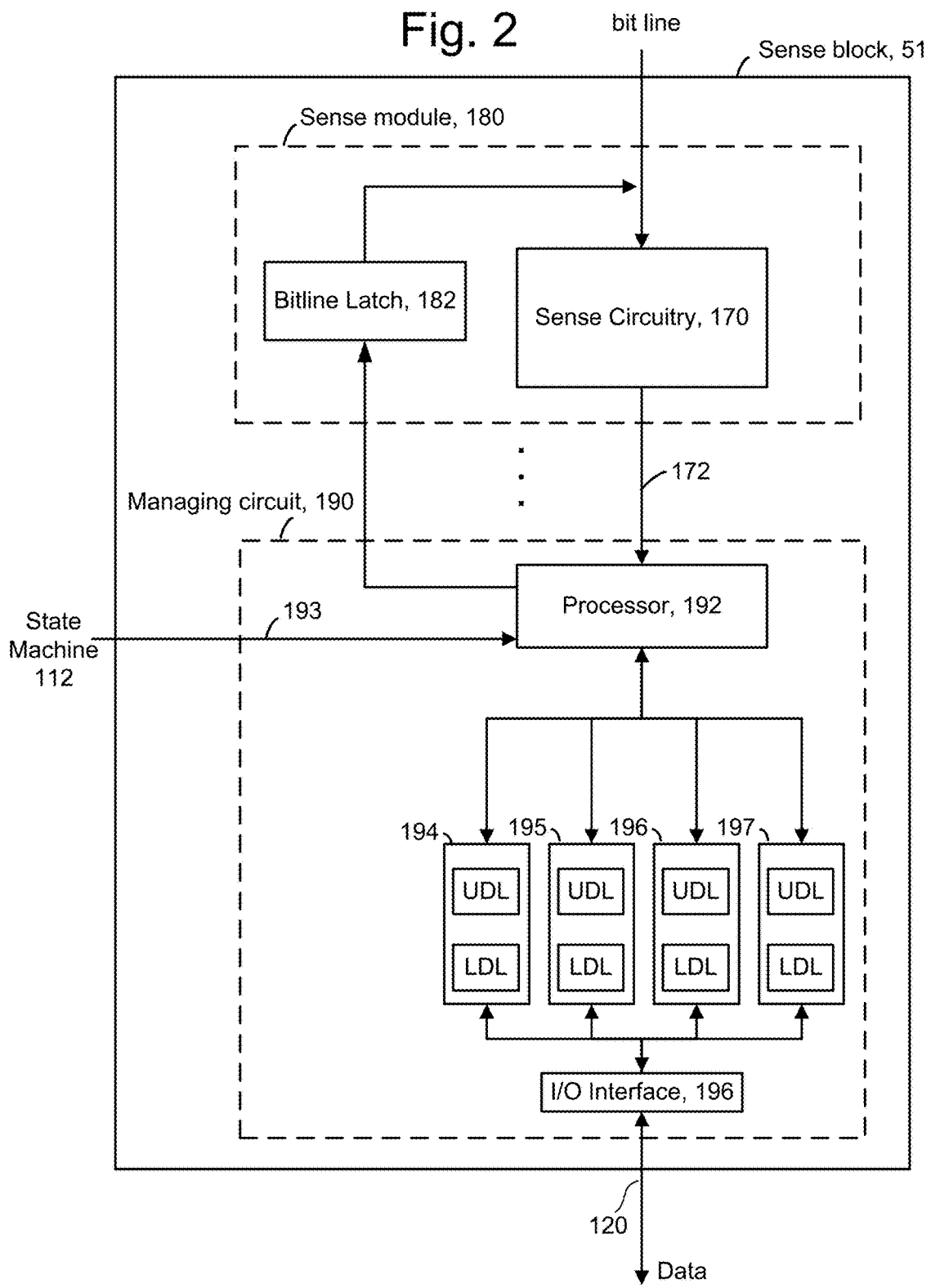
FIG. 2 is a block diagram depicting one embodiment of a sense block 51-53 of FIG. 1.

FIG. 2 is a block diagram depicting one embodiment of a sense block 51-53 of FIG. 1. An individual sense block 51 is partitioned into one or more core portions, referred to as sense modules 180 or sense amplifiers, and a common portion, referred to as a managing circuit 190. In one embodiment, there will be a separate sense module 180 for each bit line and one common managing circuit 190 for a set of multiple, e.g., four or eight, sense modules 180. Each of the sense modules in a group communicates with the associated managing circuit via data bus 172. Thus, there are one or more managing circuits which communicate with the sense modules of a set of storage elements.

Sense module 180 comprises sense circuitry 170 that performs sensing by determining whether a conduction current in a connected bit line is above or below a predetermined threshold level. Sense module 180 also includes a bit line latch 182 that is used to set a voltage condition on the connected bit line. For example, a predetermined state latched in bit line latch 182 will result in the connected bit line being pulled to a state designating program inhibit (e.g., 1.5-3 V). As an example, a flag=0 can inhibit programming, while flag=1 does not inhibit programming.

Managing circuit 190 comprises a processor 192, four example sets of data latches 194-197 and an I/O Interface 196 coupled between the set of data latches 194 and data bus 120. One set of data latches can be provide for each sense module, and data latches identified by LDL and UDL may be provided for each set. In some cases, additional data latches may be used. LDL stores a bit for a lower page of data, and UDL stores a bit for an upper page of data. This is in a four-level or two-bits per storage element memory device. One additional data latch per bit line can be provided for each additional data bit per storage element.

Processor 192 performs computations, such as to determine the data stored in the sensed storage element and store the determined data in the set of data latches. Each set of data latches 194-197 is used to store data bits determined by processor 192 during a read operation, and to store data bits imported from the data bus 120 during a programming operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed storage element. As it steps through the various predefined control gate voltages corresponding to the various memory states supported by the memory, the sense module 180 may trip at one of these voltages and a corresponding output will be provided from sense module 180 to processor 192 via bus 172. At that point, processor 192 determines the resultant memory state by consideration of the tripping event(s) of the sense module and the information about the applied control gate voltage from the state machine via input lines 193. It then computes a binary encoding for the memory state and stores the resultant data bits into data latches 194-197. In another embodiment of the managing circuit 190, bit line latch 182 serves double duty, both as a latch for latching the output of the sense module 180 and also as a bit line latch as described above.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations, the data to be programmed (write data) is stored in the set of data latches 194-197 from the data bus 120, in the LDL and UDL latches, in a two-bit per storage element implementation. In a three-bit per storage element implementation, an additional data latch may be used. The programming operation, under the control of the state machine, comprises a series of programming voltage pulses applied to the control gates of the addressed storage elements. Each program pulse is followed by a read back (verify) to determine if the storage element has been programmed to the desired memory state. In some cases, processor 192 monitors the read back memory state relative to the desired memory state. When the two are in agreement, the processor 192 sets the bit line latch 182 so as to cause the bit line to be pulled to a state designating program inhibit. This inhibits the storage element coupled to the bit line from further programming even if program pulses appear on its control gate. In other embodiments the processor initially loads the bit line latch 182 and the sense circuitry sets it to an inhibit value during the verify process.

Each set of data latches 194-197 may be implemented as a stack of data latches for each sense module. In one embodiment, there are three data latches per sense module 180. In some implementations, the data latches are implemented as a shift register so that the parallel data stored therein is converted to serial data for data bus 120, and vice versa. All the data latches corresponding to the read/write block of storage elements can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

The data latches identify when an associated storage element has reached certain mileposts in a programming operations. For example, latches may identify that a storage element's Vth is below a particular verify level. The data latches indicate whether a storage element currently stores one or more bits from a page of data. For example, the LDL latches can be used to store a lower page of data. An LDL latch is flipped (e.g., from 0 to 1) when a lower page bit is stored in an associated storage element. A UDL latch is flipped when an upper page bit is stored in an associated storage element. This occurs when an associated storage element completes programming, e.g., when its Vth exceeds a target verify level such as VvA, VvB or VvC.

Figure 3:
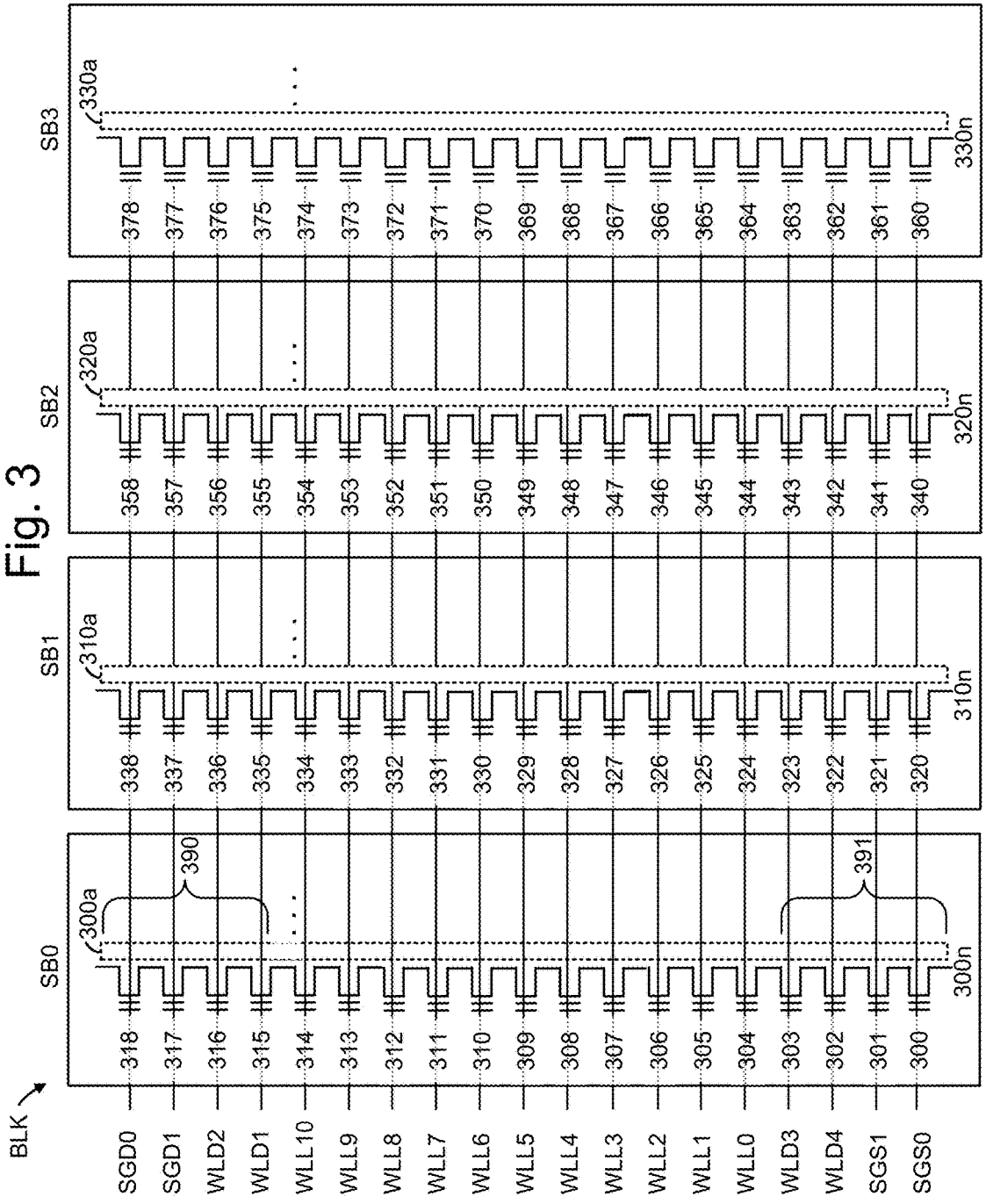
FIG. 3 depicts an example implementation of the memory structure 126 of FIG. 1 comprising NAND strings in sub-blocks in a 3D configuration.

FIG. 3 depicts an example implementation of the memory structure 126 of FIG. 1 comprising NAND strings in sub-blocks in a 3D configuration. In one approach, a block BLK of memory cells is formed from a stack of alternating conductive and dielectric layers. The block comprises conductive layers spaced apart vertically, and the conductive layers spaced apart vertically comprise word lines connected to the memory cells and select gate lines connected to SGD (drain-side select gate) and SGS (source-side select gate) transistors. In this example, the conductive layers comprise two SGD layers, two SGS layers and four dummy word line layers (or word lines) WLD1, WLD2, WLD3 and WLD4, in addition to data word line layers (or word lines) WLL0-WLL10. The dielectric layers are labelled as DL0-DL19. Each NAND string may be formed in a memory hole in the stack is filled with materials which form memory cells adjacent to the word lines.

Further, each block can be divided into sub-blocks and each sub-block includes multiple NAND strings, where one example NAND string is depicted. For example, sub-blocks SB0, SB1, SB2 and SB3 comprise example NAND strings 300n, 310n, 320n and 330n, respectively. The NAND strings have data word lines, dummy word lines and select gate lines. Each sub-block comprises a set of NAND strings which extend in the x direction and which have a common SGD line. The NAND strings 300n, 310n, 320n and 330n are in sub-blocks SB0, SB1, SB2 and SB3, respectively. Programming of the block may occur one sub-block at a time. Within each sub-block, a word line programming order may be followed, e.g., starting at WL0, the source-side word line and proceeding one word line at a time to WLL10, the drain-side word line.

The NAND strings 300n, 310n, 320n and 330n have channels 300a, 310a, 320a and 330a, respectively. Each channel has a drain end and a source end. For example, the channel 300a has a drain end 390 and a source end 391.

Additionally, NAND string 300n includes SGS transistors 300 and 301, dummy memory cells 302 and 303, data memory cells 304, 305, 306, 307, 308, 309, 310, 311, 312, 313 and 314, dummy memory cells 315 and 316, and SGD transistors 317 and 318.

NAND string 310n includes SGS transistors 320 and 321, dummy memory cells 322 and 323, data memory cells 324, 325, 326, 327, 328, 329, 330, 331, 332, 333 and 334, dummy memory cells 335 and 336, and SGD transistors 337 and 338.

NAND string 320n includes SGS transistors 340 and 341, dummy memory cells 342 and 343, data memory cells 344, 345, 346, 347, 348, 349, 350, 351, 352, 353 and 354, dummy memory cells 355 and 356, and SGD transistors 357 and 358.

NAND string 330n includes SGS transistors 360 and 361, dummy memory cells 362 and 363, data memory cells 364, 365, 366, 367, 368, 369, 370, 371, 372, 373 and 374, dummy memory cells 375 and 376, and SGD transistors 377 and 378.

FIG. 4 depicts an example memory cell 790. The memory cell comprises a control gate CG which receives a word line voltage Vw1, a drain at a voltage Vd, a source at a voltage Vs and a channel at a voltage Vch.

FIG. 5 depicts an example Vth distribution of memory cells, where four data states are used. The data states are represented by Vth distributions 510, 511, 512 and 513 for the S0 (erased), S1, S2 and S3 states, respectively. The optimum read voltages generally are midway between the Vth distributions of adjacent data states. The read voltages for the S1, S2 and S3 states are VrS0, VrS1 and VrS2, respectively. During a programming operation, separate verify voltages, e.g., VvS0, VvS1 and VvS2, may be used. See, e.g., FIG. 7. In another approach, a single verify voltage is used which is common to the different assigned data states.

Each read voltage demarcates a lower boundary of a data state of a plurality of data states. For example, VrS0 demarcates a lower boundary of the S0 state.

An example encoding of bits for each state is 11, 10, 00 and 01, respectively, in the format of upper page (UP) bit/lower page (LP) bit. A LP read may use VrS1 and VrS3 and an UP read may use VrS2. A lower or upper bit can represent data of a lower or upper page, respectively. With these bit sequences, the data of the lower page can be determined by reading the memory cells using read voltages of VrS1 and VrS3. The lower page (LP) bit=1 if Vth<=VrS1 or Vth>VrS3. LP=0 if VrS1<Vth<=VrS3. The upper page (UP) bit=1 if Vth<=VrS2 and LP=0 if Vth>VrS2. In this case, the UP is an example of a page which can be determined by reading using one read voltage applied to a selected word line. The UP is an example of a page which can be determined by reading using two read voltages applied to a selected word line.

FIG. 6 depicts an example Vth distribution of memory cells, where eight data states are used. The S0-S7 states have Vth distributions 520-527, respectively. For the S1-S7 states, we have verify voltages VvS1-VvS7, respectively, in one possible approach. For the S1-S7 states, we have read voltages VrS1-VrS7, respectively, and example encoding of bits of 111, 110, 100, 000, 010, 011, 001 and 101, respectively. The bit format is: UP/MP/LP.

Each memory cell may be associated with a data state according to user data associated with a program command. Generally, a memory device comprises memory cells which store words of user data as code words. Each code word comprises symbols, and each data state represents one of the symbols. When a cell stores n bits of data, the symbols can have one of 2^n possible values. The data states include an erased state and one or more programmed or assigned data states. A programmed state is a data state to which a memory cell is to be programmed in a programming operation. The symbol or data state which is to be represented by a cell is identified by one or more bits of write data in latches associated with the memory cell. This data state is the assigned data state. Each data state corresponds to a different range of threshold voltages (Vth).

Based on its assigned data state, a memory cell will either remain in the erased state or be programmed to a programmed data state. For example, in a one bit per cell memory device, there are two data states including the erased state and a programmed state. In a two-bit per cell memory device, there are four data states including the erased state (S0) and three higher data states referred to as the S1, S2 and S3 data states (see FIG. 5). In a three-bit per cell memory device, there are eight data states including the erased state and seven higher data states referred to as the S1, S2, S3, S4, S5, S6 and S7 data states (see FIG. 6). Similarly, in a four-bit per cell memory device, there are sixteen data states including the erased state and fifteen higher data states.

After the memory cells are programmed, the data can be read back in a read operation. A read operation can involve applying a series of read voltages to a word line while sensing circuitry determines whether cells connected to the word line are in a conductive or non-conductive state. If a cell is in a non-conductive state, the Vth of the memory cell exceeds the read voltage. The read voltages are set at levels which are expected to be between the threshold voltage levels of adjacent data states.

Figure 7:
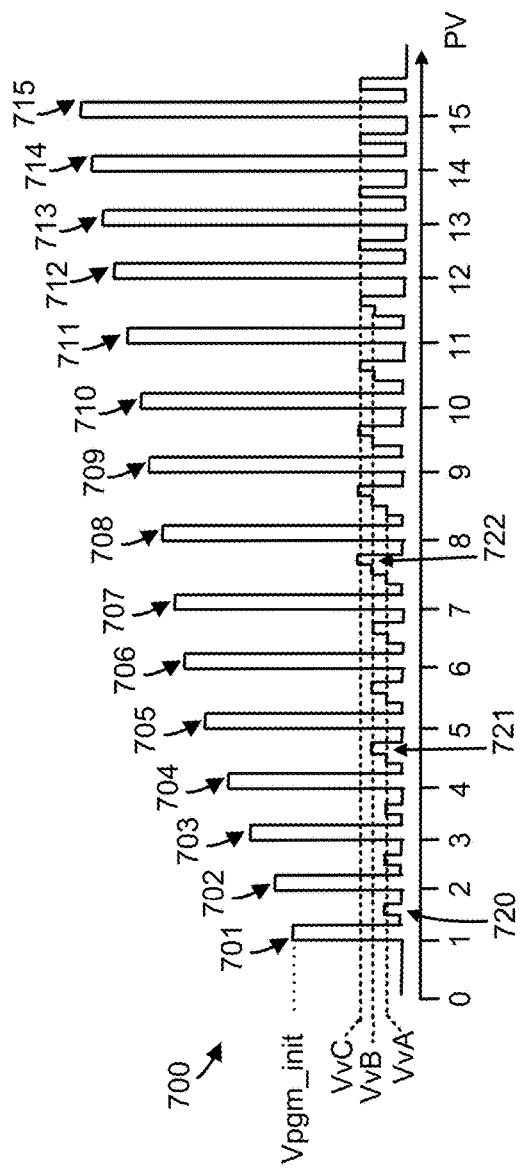
FIG. 7 depicts a series of program-verify iterations or loops in an example programming operation for a set of memory cells.

FIG. 7 depicts a series of program-verify iterations or loops in an example programming operation for a set of memory cells. The horizontal axis depicts a program-verify iteration number (PV) and the vertical axis depicts control gate or word line voltage. The pulse train 700 includes a series of program pulses 701-715 that are applied to a word line selected for programming. Vpgm_init is an initial program voltage. One, two or three verify pulses are provided after each program pulse as an example, based on the target data states which are being verified. For example, one or more of an example A-state verify pulse 720 (VvA), B-state verify pulse 721 (VvB) and C-state verify pulse 722 (VvC) may be applied in different program-verify iterations.

Figure 8:
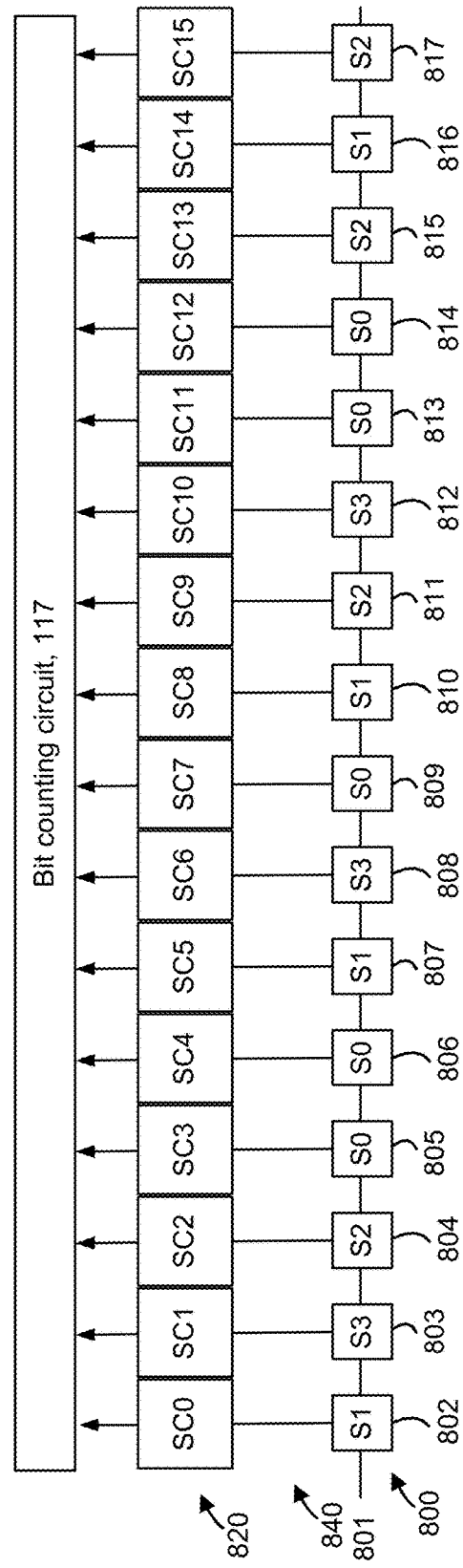
FIG. 8 depicts a set of memory cells 800, associated sense circuits 820 and the bit counting circuit 117 of FIG. 1.

FIG. 8 depicts a set of memory cells 800, associated sense circuits 820 and the bit counting circuit 117 of FIG. 1. Each memory cell is connected to a respective sense circuit by a respective bit line in a set of bit lines 840, in one approach. This allows sensing to be performed in parallel for each memory cell. The memory cells are connected to a word line 801 and include example memory cells 802-817 connected to sense circuits SC0-SC15, respectively. An example assigned data state of each cell, e.g., S0-S3, is also depicted, consistent with FIG. 5. During a programming operation, the sense circuits may store a bit which indicates whether a verify test has been passed for each cell relative to its assigned data state (where the assigned state is one of the programmed states and not the erased state). The bit counting circuit counts the bits having a specified value to determine if programming is completed for an assigned data state. In theory, the bit counting circuit could count the number of cells which have passed their verify test. However, the count would become very large, making the process more complex. In practice, it is more efficient to count the number of cells which have not passed their verify test. If the count becomes larger than a threshold before all of the bits are counted, the count can be terminated, in one approach, since it is already known that the programming has not been completed for the assigned data state.

FIG. 9A depicts a flowchart of an example programming operation in which fail bits are counted. Step 900 begins a program loop. Step 901 sets a program or lockout status for each memory cell in a set of memory cells, and sets a corresponding bit line voltage (e.g., Vb1=high for lockout and Vb1=0 V for program). Step 902 includes applying a program voltage to the set of memory cells, e.g., via a selected word line. Step 903 includes performing a verify test for one or more assigned data states. Step 904 sets a pass or fail bit in the sense circuit for each memory cell which was subject to a verify test. Step 905 counts the number of fail bits for each state. At step 906, if the number of fail bits is less than a threshold such as 1% of the cells of a given assigned data state, the control declares that programming is completed for the assigned data state. A decision step 907 determines whether programming is completed for all assigned states. If this is true, the programming of the set of memory cells is completed at step 908. If decision step 907 is false, a next program loop begins at step 900. The program voltage may also be incremented in each successive program loop.

FIG. 9B depicts a flowchart of an example bit counting process which implements step 905 of FIG. 9A. Step 920 includes loading a portion of the bits into a plurality of sets of tag circuits. As an example, FIGS. 10 and 11 include sets of tag circuits 1001-1001$b$, 1010-1010$b$, 1011-1011$b$ and 1012-1012$b$. The bits can be loaded from latches associated with the sense circuits, for example. Typically, it is efficient to load only a portion of the bits at a set of bits so that the tag circuits do not consume too much space on the chip. Step 921 includes, in each set of tag circuits, setting a pass or no pass state serially in each tag circuit, one tag circuit after another, and outputting one or more signals which indicate a number of fail bits. A fail bit or error bit is used herein as an example of a bit of one specified value, e.g., 0 or 1 while a pass bit is used herein as an example of a bit of another specified value, e.g., 1 or 0, respectively. Step 922 includes, in each set of aggregation circuits, evaluating the signals from multiple sets of tag circuits serially, one set after another, and outputting a signal indicating a corresponding number of fail bits.

Step 923 includes, at an accumulator, counting the number of fail bits based on the signals from the tag circuits. Step 924 includes providing the total number of fail bits from the accumulator to a controller. A decision step 925 may be implemented at the controller and includes determining whether the count exceeds a threshold. This count may include a sum of all counts provided to the controller from the accumulator. If decision step 925 is true, the count is terminated at step 927. If decision step 925 is false, a decision step 926 determines whether there are more bits to count. If decision step 926 is true, the counting process is repeated for a next portion of the bits at step 920. If decision step 926 is false, the count is completed and is terminated at step 927.

FIG. 9C depicts a flowchart of an example bit counting process which implements step 922 of FIG. 9B. Step 930 includes, in a top level of aggregation circuits, aggregating the signals from multiple tag circuits serially and outputting a signal indicating a corresponding number of fail bits, 930. Step 931 includes, in a next lower level of aggregation circuits, aggregating the signals from multiple aggregation circuits in the top level serially and outputting a signal indicating a corresponding number of fail bits. The next lower level may be a bottom level of the hierarchy when there are two levels, for instance. The hierarchy may have two or more levels. Generally, the counts can be provided to the accumulator more quickly when there are more levels in the hierarchy because there is less serial processing in each level. A disadvantage to more levels in the hierarchy is increased hardware on the chip.

Figure 10:
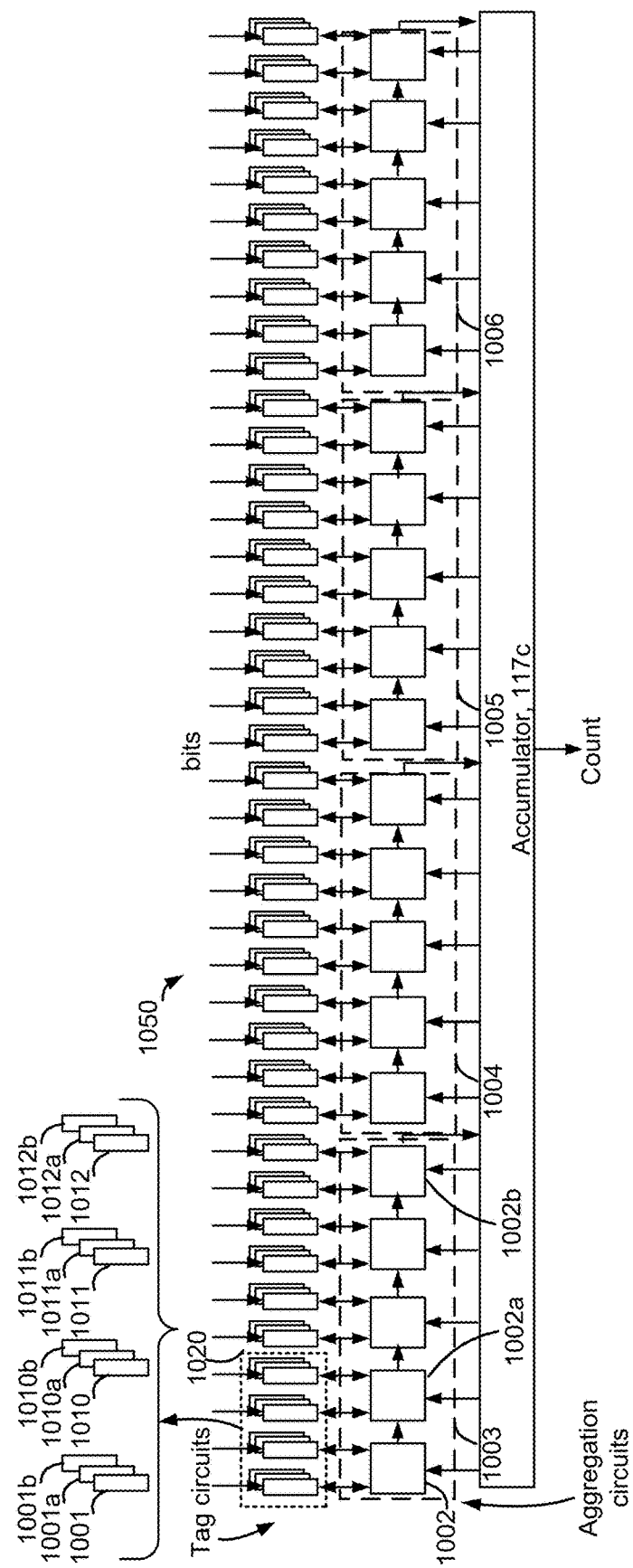
FIG. 10 depicts an example implementation of the bit counting circuit 117 of FIGS. 1 and 8 in which bit counts are aggregated by multiple sets of aggregation circuits.

FIG. 10 depicts an example implementation of the bit counting circuit 117 of FIGS. 1 and 8 in which bit counts are aggregated by multiple sets of aggregation circuits. The circuit 1050 include many sets of tag circuits. In each set, the tag circuits operate serially, in one or more chains. The set can include a number of tag circuits as described further below, e.g., as in FIGS. 12 and 15A. Each rectangle in the top row of the figure represents a set of tag circuits. A portion of the tag circuits is shown in a region 1020. This region includes sets of tag circuits 1001, 1001a, 1001b, 1010, 1010a and 1010b which are associated with an aggregation circuit 1002, and sets of tag circuits 1011, 1011a, 1011b, 1012, 1012a and 1012b which are associated with an aggregation circuit 1002a. The association of a set of tag circuits to an aggregation circuit involves the set of tag circuits providing an output signal indicating a count of fail bits to the aggregation circuit. Many other sets of tag circuits are also depicted and multiple sets of tag circuits are associated with a respective aggregation circuit.

Bits are loaded into the tag circuits from a set of bits in which fail bits, for instance, are to be counted. The loading can occur in cycles such that the count is obtained for different portions of the bits in turn, one portion at a time. Each set of tag circuits may output a signal indicating a count of fail bits among the bits which are processed by the set. In one approach, one bit is processed by each tag circuit. Each tag circuit is set in a pass or no pass state based on the bit value. Based on the state of a tag circuit, the output signal will be high or low. The number of fail bits can be determined based on the high or low portions of the output signal.

Each square in the middle row of the figure represents an aggregation circuit. Each aggregation circuit receives one or more output signals from each of multiple sets of tag circuits. Multiple sets of tag circuits may provide their output signals to one aggregation circuit. In one approach, an aggregation circuit receives the outputs serially one after another and passes a corresponding signal to another aggregation circuit or to the accumulator 117c. The corresponding signal indicates a number of fail bits from each set of tag circuits. For example, the aggregation circuit 1002 may receive outputs in turn from the sets 1001, 1001a, and then from the set 1001b. At the same time period, the aggregation circuit 1002a may receive outputs in turn from the sets 1011, 1011a and 1011b. The remaining aggregation circuits may similarly receive outputs from different sets of tag circuits. See FIG. 14 for a further example.

In this example, five aggregation circuits operate serially in a set of aggregation circuits. For example, four sets of aggregation circuits 1003, 1004, 1005 and 1006 are depicted. An arrow after the last aggregation circuit in a set (such as aggregation circuit 1002b in the set 1003) represents an output signal comprising count data for all of the aggregation circuits in a set. This is count data from all of the sets of tag circuits which communicate with the aggregation circuits in the set. The output signals from each set of aggregation circuits is provided to the accumulator. The accumulator sums the bit counts in a current cycle and may output the sum to a controller, in one approach. In this case, the controller totals the different sums which are received as new bits are loaded into the tag circuits until the counting processed is concluded and a grand total of fail bits is obtained. Alternatively, the accumulator may obtain the grand total and provide it to the controller when the counting processed is concluded.

Figure 11:
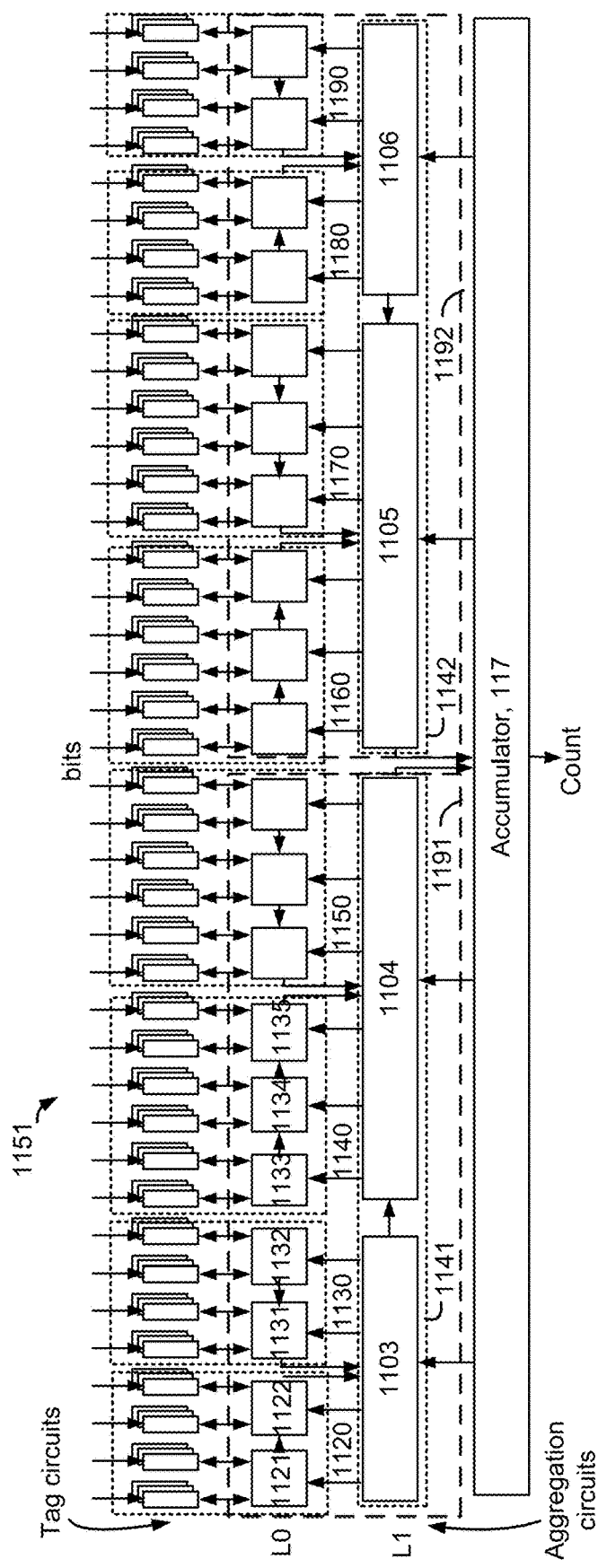
FIG. 11 depicts an example implementation of the bit counting circuit 117 of FIGS. 1 and 8 in which bit counts are aggregated by multiple set of aggregation circuits in two levels of a hierarchy.

The processing of the aggregation circuits in each set may occur serially, while the processing occurs in parallel among the different sets of aggregation circuits. This example provides aggregation circuits in one level rather than in a hierarchy. FIG. 11 provides an example of a hierarchy.

FIG. 11 depicts an example implementation of the bit counting circuit 117 of FIGS. 1 and 8 in which bit counts are aggregated by multiple set of aggregation circuits in two levels of a hierarchy. The circuit 1151 include the same sets of tag circuits as in FIG. 10. A top level of the hierarchy (L0) includes different sets of aggregation circuits, such as sets 1120, 1130, 1140, 1150, 1160, 1170, 1180 and 1190. Each set has multiple aggregation circuits which operate serially. Moreover, the number of aggregation circuits in each set can be different. For example, there are two aggregation circuits in each of set 1120, 1130, 1180 and 1190 and three aggregation circuits in each of sets 1140, 1150, 1160 and 1170.

In one approach, the sets of aggregation circuits are configured symmetrically such that the larger sets are near the center of the circuit and the smaller sets are at the edges of the circuit. This helps provide an equal maximum delay relative to the accumulator. For example, signals from the aggregation circuit 1121 pass through three other aggregation circuits, e.g., aggregation circuits 1122, 1103 and 1104 before reaching the accumulator. Signals from the aggregation circuit 1133 pass through three other aggregation circuits, e.g., aggregation circuits 1134, 1135 and 1104 before reaching the accumulator. Thus, there is an approximately equal maximum delay of three aggregation circuits for the output of any aggregation circuit to reach the accumulator. A further delay is a function of the number of sets of tag circuits which operate serially (e.g., three sets—see also FIG. 14).

In FIG. 10, signals from the aggregation circuit 1002 pass through four other aggregation circuits before reaching the accumulator.

A next lower level of the hierarchy (L1), which is also the bottom level in this example, includes different sets of aggregation circuits, such as sets 1141 and 1142. Each set has multiple aggregation circuits which operate serially. There are two aggregation circuits in each set in this example. Each aggregation circuit in L1 can receive output signals from multiple sets of aggregation circuits in L0. For example, the aggregation circuit 1103 can receive output signals from the sets of aggregation circuits 1120 and 1130, and the aggregation circuit 1104 can receive output signals from the sets of aggregation circuits 1140 and 1150.

Multiple sets of aggregation circuits in L0 may provide their output signals to one aggregation circuit in L1. In one approach, an aggregation circuit receives the outputs serially one after another and passes a corresponding signal to another aggregation circuit or to the accumulator 117c. The corresponding signal indicates a number of fail bits. For example, the aggregation circuit 1103 may receive outputs in turn from the sets 1120 and 1130. Or, the outputs may be received from different sets of aggregation circuits in L0 concurrently. At the same time period, the aggregation circuit 1004 may receive outputs in turn or concurrently from the sets 1140 and 1150. The remaining aggregation circuits in L1 may similarly receive outputs from different sets of aggregation circuits in L0.

In this example, two aggregation circuits in L1 operate serially in a set of aggregation circuits. For example, aggregation circuits 1103 and 1104 may operate serially, and aggregation circuits 1105 and 1105 may operate serially. The sets 1141 and 1142 may operate in parallel. A region 1191 represents one set of aggregation circuits in a hierarchy, and the region 1192 represents another set of aggregation circuits in the hierarchy. These sets of aggregation circuits may operate in parallel with one another, in one approach.

An arrow after the last L1 aggregation circuit in a set (such as aggregation circuit 1104 in the set 1141, or aggregation circuit 1105 in the set 1142) represents an output signal comprising count data for all of the aggregation circuits in the set. This is count data from all of the sets of tag circuits which communicate with the aggregation circuits in the set. The output signal from each set of L1 aggregation circuits is provided to the accumulator.

Figure 12:
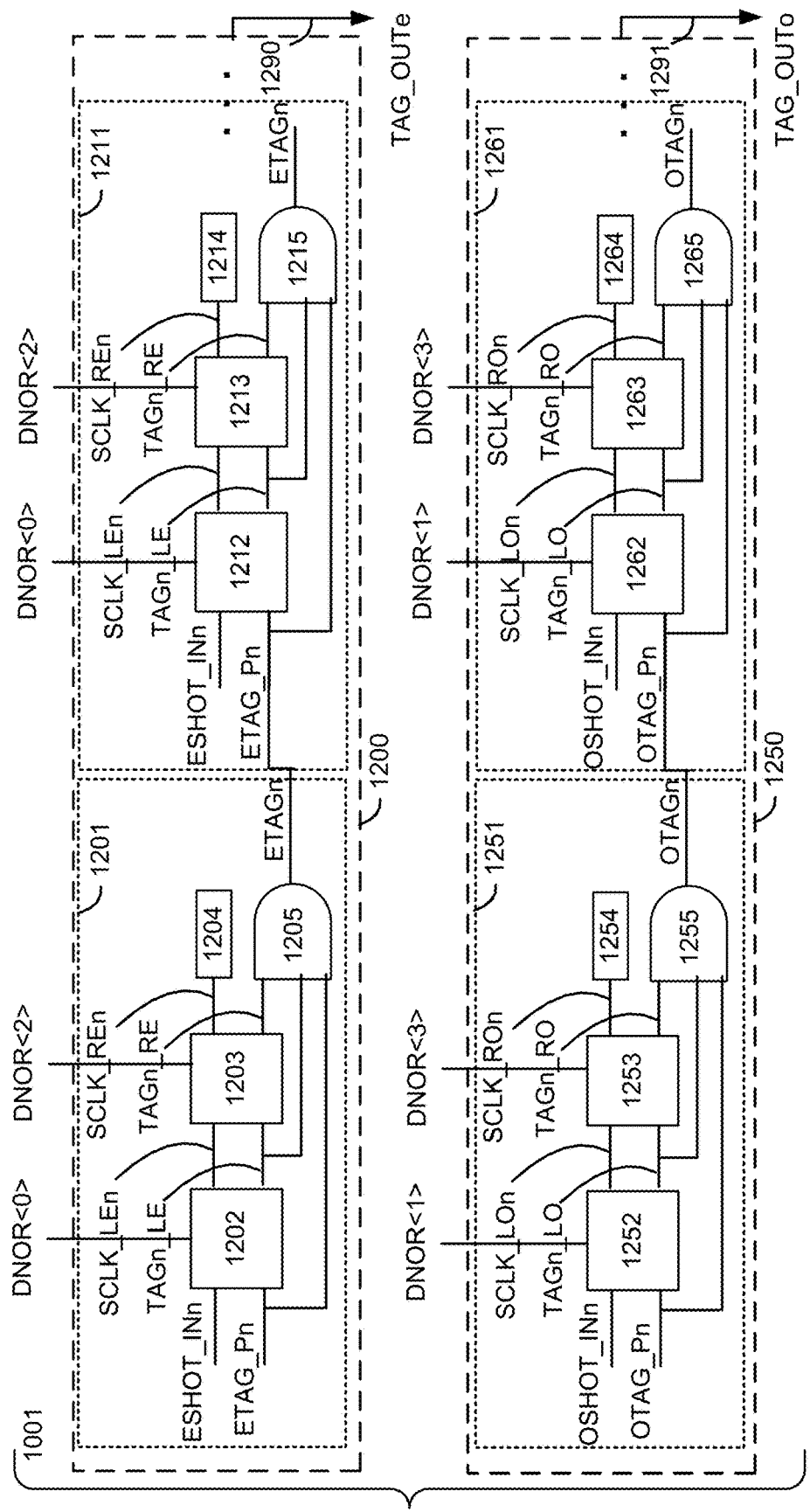
FIG. 12 depicts an example implementation of the set of tag circuits 1001 of FIG. 10 or 11.

FIG. 12 depicts an example implementation of the set of tag circuits 1001 of FIG. 10 or 11. As mentioned, a set of tag circuits can be arranged serially, in a chain. In this example, there are two sets of tag circuits—one set 1200 for bits in an even-numbered group of bits, and one set 1250 for bits in an odd-numbered group of bits. In a set of bits, a number of bits in the even-numbered group may alternate with a number of bits in the odd-numbered group, in one approach. This grouping is relevant in some memory devices in which alternating groups of sense circuits are in even or odd-numbered groups. For example, bits in the even-numbered group may be from a first half of a page of data and bits in the odd-numbered group may be from a second half of a page of data. The use of different sets of tag circuits in this way is optional.

Many, perhaps hundreds or thousands of tag circuits can be arranged serially in a set of tag circuits. The processing delay is higher when the number is higher. Further, the tag circuits can be arranged in groups, where each group has multiple tag circuits. The set 1200 includes tag circuit groups 1201 and 1211, and the set 1250 includes tag circuit groups 1251 and 1261. A group has two tag circuits in this example. In another possibility, the tag circuits are not arranged in groups. Each group receives a clock signal and a tag signal, and passes the tag signal to the next group until the final group in the set is reached. The final group passes an output to an aggregation circuit, as mentioned. The output indicates a number of fail bits among the bits which were processed by the set of tag circuits. In this example, one output indicates a number of fail bits among the bits which were processed by the set 1200, and another output indicates a number of fail bits among the bits which were processed by the set 1250.

The tag circuit group 1201 includes tag circuits 1202 and 1203. See FIG. 15A for further details. A bit is loaded into the tag circuit 1202 via a path DNOR<0> and a bit is loaded into the tag circuit 1203 via a path DNOR<2>. Each bit value indicates whether the respective tag circuit into which it is loaded will be in a pass or no pass state. A clock signal ESHOT_IN and a tag signal ETAG_Pn are provided to the first tag circuit 1202 in the group. In response, the tag circuit 1202 provides the clock signal SCLK_LEn and the tag signal TAGn_LE to the tag circuit 1203 which may be identical to the tag circuit 1202. The tag circuit 1203 receives the inputs and provides a clock output SCLK_REn to a return node 1204, and a tag signal TAGn_RE to an AND gate 1205. The AND gate also receives ETAG_Pn and TAGn_LE and provides a high output if each of the inputs is high; otherwise, it provides a low output. The output ETAGn is provided as the input to the next tag circuit 1212.

In the tag circuit group 1211, a bit is loaded into the tag circuit 1212 via a path DNOR<0> and a bit is loaded into the tag circuit 1213 via a path DNOR<2>. The tag circuit 1212 receives the same clock signal ESHOT_INn as the other tag circuits in the set. It operates in the same way as described to provide a clock and tag signals to the tag circuit 1213. The tag circuit 1213 receives the inputs and provides the clock output SCLK_REn to a return node 1214, and the tag signal TAGn_RE to an AND gate 1215. The output ETAGn of the AND gate is provided as the input to the next tag circuit. The last tag circuit in the set provides an output TAG_OUTe on an output path 1290 which includes high and low levels which indicate a count of fail bits.

The set 1250 operates similarly as the set 1200 but processes the bits of the odd-numbered group. The tag circuit group 1251 includes tag circuits 1252 and 1253. A bit is loaded into the tag circuit 1252 via a path DNOR<1> and a bit is loaded into the tag circuit 1253 via a path DNOR<3>. A clock signal OSHOT_IN and a tag signal OTAG_Pn are provided to the tag circuit 1252. In response, the tag circuit 1252 provides the clock signal SCLK_LOn and the tag signal TAGn_LO to the tag circuit 1253. The tag circuit 1253 receives the inputs and provides a clock output SCLK_ROn to a return node 1254, and a tag signal TAGn_RO to an AND gate 1255. The AND gate also receives OTAG_Pn and TAGn_LO. The output OTAGn is provided as the input to the next tag circuit 1262.

In the tag circuit group 1261, a bit is loaded into the tag circuit 1262 via a path DNOR<1> and a bit is loaded into the tag circuit 1263 via a path DNOR<3>. The tag circuit 1262 receives the same clock signal OSHOT_INn as the other tag circuits in the set. It operates in the same way as described previously to provide a clock and tag signals to the tag circuit 1263. The tag circuit 1263 receives the inputs and provides the clock output SCLK_ROn to a return node 1264, and the tag signal TAGn_RO to an AND gate 1265. The output OTAGn of the AND gate is provided as the input to the next tag circuit. The last tag circuit in the set provides an output TAG_OUTo on an output path 1291 which includes high and low levels which indicate a count of fail bits.

In an implementation in which the separate even-odd bit counts are not used, one of the sets of tag circuits can be omitted.

Each set of tag circuits is sometimes referred to as a shooting chain because a SHOT pulse can pass through it very quickly if the tag circuits are all in the pass state. When a tag circuit receives the SHOT signal, it decides based on the TAG input whether to reset the tag circuit. A number of tag circuits can share the same SHOT and have their TAG inputs connected in series. By reducing the step of sending one SHOT pulse to see if there are any TAG signals to count, the overhead is reduced. Further, by using a hierarchical or multi-tier feedback, it is possible to run a faster clock frequency so that faster fail bit count can be achieved. Moreover, when the bit counting is used in a programming process for a memory device, some of the counting can occur during a program pulse to avoid a time penalty.

Figure 13:
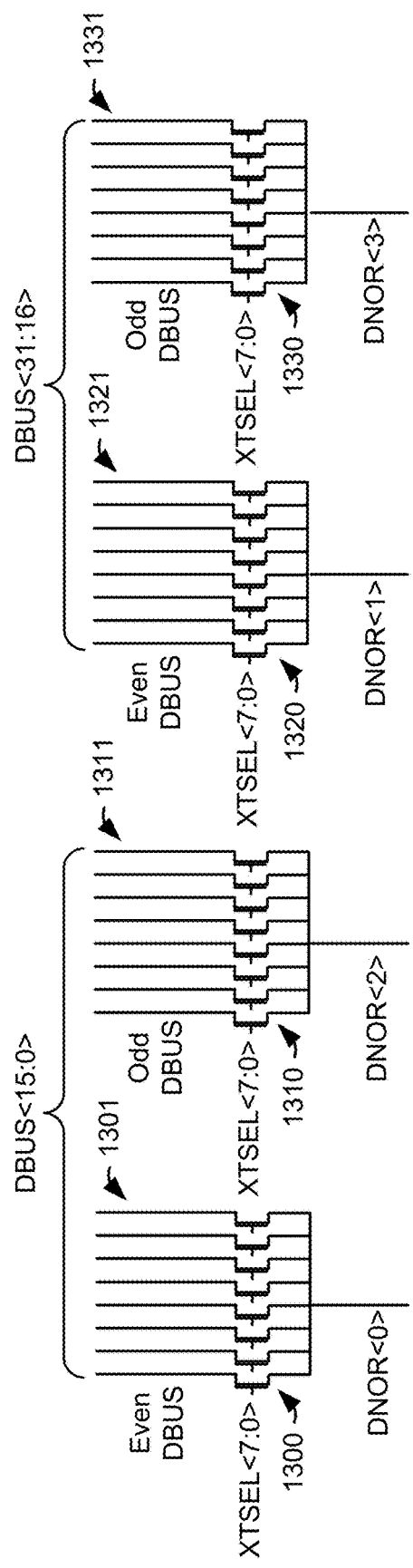
FIG. 13 depicts an example circuit for loading bits into the tag circuits of FIG. 12.

FIG. 13 depicts an example circuit for loading bits into the tag circuits of FIG. 12. The input paths DNOR<0> to DNOR<3> to the tag circuits of FIG. 12 are depicted. In this example, in a set of eight bits, one bit at a time is loaded into a tag circuit via DNOR<0> by selecting each of the select transistors in a set of select transistors 1300 in turn. A select signal XTSEL<7:0> is used to control each set of the select transistors. The bits are provided on even-numbered buses 1301 (Even DBUS). Similarly, one bit at a time is loaded into another tag circuit via DNOR<2> by selecting each of the select transistors in a set of select transistors 1310 in turn. The bits are provided on odd-numbered buses 1311 (Odd DBUS). Bits are loaded into another tag circuit via DNOR<1> using a set of select transistors 1320 and buses 1321, and bits are loaded into another tag circuit via DNOR<3> using a set of select transistors 1330 and buses 1331. In one possible implementation, the entire set of bits is loaded in, in eight loading cycles. In other implementations, the loading is repeated one or more times for a new set of eight bits for each tag circuit.

Figure 14:
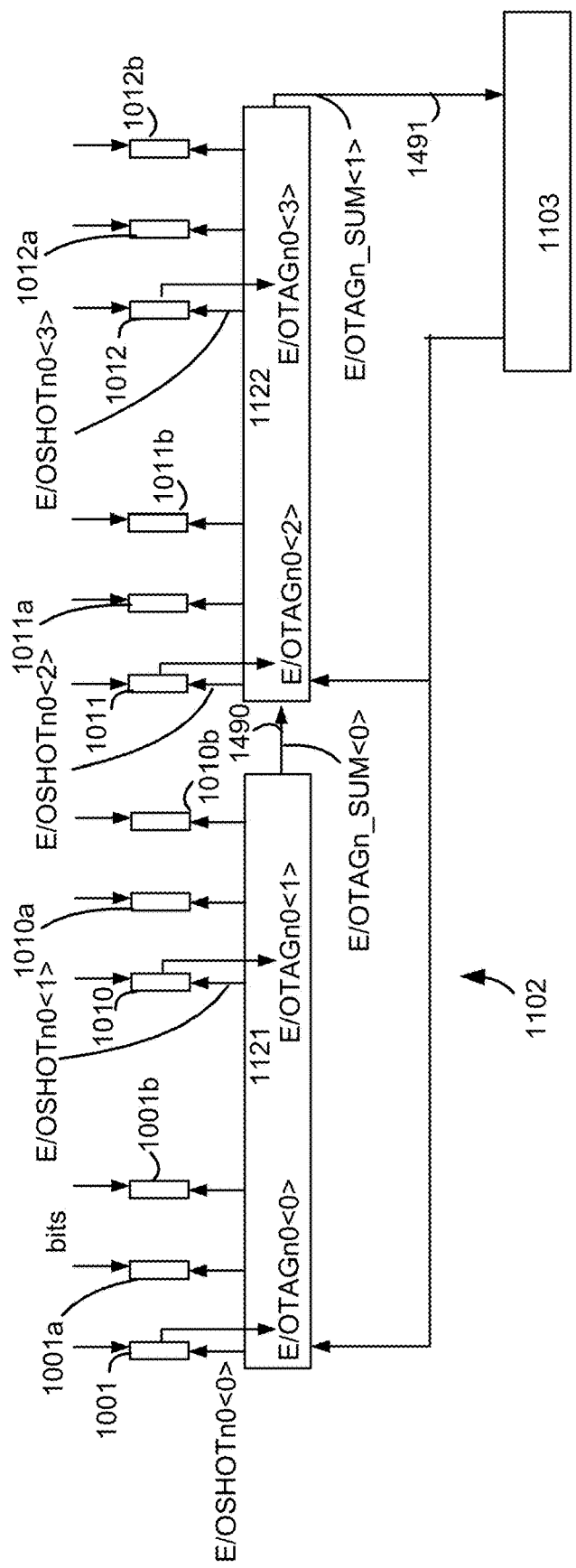
FIG. 14 depicts a portion of the circuit of FIG. 11 in further detail.

FIG. 14 depicts a portion of the circuit of FIG. 11 in further detail. The portion includes the sets of tag circuits 1001, 1001a, 1001b, 1010, 1010a, 1010b, 1011, 1011a, 1011b, 1012, 1012a and 1012b, the top level aggregation circuits 1121 and 1122 and the bottom level aggregation circuit 1103. The processing of a plurality of sets of tag circuits can occur serially in one approach, one set after another. For example, the aggregation circuit 1121 can provide the even or odd clock signal E/OSHOTn0<0> to the set 1001, which loads in respective bits and provides an even or odd output E/OTAGn0<0>. Subsequently, the aggregation circuit 1121 provides E/OSHOTn0<0> to the set 1001a, which loads in respective bits and provides E/OTAGn0<0>. Subsequently, the aggregation circuit 1121 provides E/OSHOTn0<0> to the set 1001b, which loads in respective bits and provides E/OTAGn0<0>.

In one approach, at the same time, e.g., in parallel, as the processing occurs for the plurality of sets 1001, 1001a and 1001b, processing may occur for the plurality of sets 1010, 1010a and 1010b. The processing within the plurality of sets 1010, 1010a and 1010b may occur serially, one set at a time, in one approach. For example, the aggregation circuit 1121 can provide an even or odd clock signal E/OSHOTn0<1> to the set 1010, which loads in respective bits and provides an even or odd output E/OTAGn0<1>. Subsequently, the aggregation circuit 1121 provides E/OSHOTn0<1> to the set 1010a, which loads in respective bits and provides E/OTAGn0<1>. Subsequently, the aggregation circuit 1121 provides E/OSHOTn0<1> to the set 1001b, which loads in respective bits and provides an output E/OTAGn0<1>. In this example, the parallel processing of sets of tag circuits is enabled by the two separate clock signals.

Processing in the plurality of sets 1011, 1011a and 1011b can similarly occur in parallel with processing of the plurality of sets 1012, 1012a and 1012b. The processing within the plurality of sets 1011, 1011a and 1011b may occur serially, in one approach. For example, the aggregation circuit 1122 can provide an even or odd clock signal E/OSHOTn0<2> to the set 1011, which loads in respective bits and provides an even or odd output E/OTAGn0<2>. Subsequently, the aggregation circuit 1122 provides E/OSHOTn0<2> to the set 1011a, which loads in respective bits and provides E/OTAGn0<2>. Subsequently, the aggregation circuit 1122 provides E/OSHOTn0<2> to the set 1011b, which loads in respective bits and provides an output E/OTAGn0<2>.

The processing within the plurality of sets 1012, 1012a and 1012b may occur serially, in one approach. For example, the aggregation circuit 1122 can provide an even or odd clock signal E/OSHOTn0<3> to the set 1012, which loads in respective bits and provides an even or odd output E/OTAGn0<3>. Subsequently, the aggregation circuit 1122 provides E/OSHOTn0<3> to the set 1012a, which loads in respective bits and provides E/OTAGn0<3>. Subsequently, the aggregation circuit 1122 provides E/OSHOTn0<3> to the set 1012b, which loads in respective bits and provides an output E/OTAGn0<3>.

In another possible approach, the processing occurs serially, one set at a time, among all of the sets of tag circuits associated with one aggregation circuit. For example, one clock could be used in the aggregation circuit 1121 in this approach. In another possible approach, the processing occurs in parallel among all of the sets of tag circuits associated with one aggregation circuit. Although, this would result in additional complexity.

In one approach, after the fail bits are summed by the aggregation circuit 1121, a corresponding output signal E/OTAGn$_{13}$SUM<0> is provided to the aggregation circuit 1122 on a path 1490. The aggregation circuit 1122 in turn provides an output signal E/OTAGn$_{13}$SUM<1> on a path 1491, which represents a sum of fail bits from both of the aggregation circuits 1121 and 1122, to the next lower level aggregation circuit 1103. Referring also to FIG. 11, the L1 aggregation circuit 1103 receives sums of fail bits which are gathered by the L0 aggregation circuits 1121, 1122, 1131 and 1132 in the sets of aggregation circuits 1120 and 1130. Subsequently, the L1 aggregation circuit 1104 receives sums of fail bits which are gathered by the corresponding sets of aggregation circuits 1140 and 1150. Moreover, the L1 aggregation circuits 1103 and 1106 may operate in parallel, while the L1 aggregation circuits 1104 and 1105 may also operate in parallel. The accumulator receives a sum of fail bits from each of the sets of L1 aggregation circuits 1141 and 1142, in this example.

The control circuit will decide if it should send a SHOT signal to reset the TAG circuits. The aggregation circuits can operate in a similar way to the tag circuits in that a SHOT input is shared with other aggregation circuits in the same set. However, an aggregation circuit has the additional task of sending the SHOT signal to the associated tag circuits it controls.

Figure 15A:
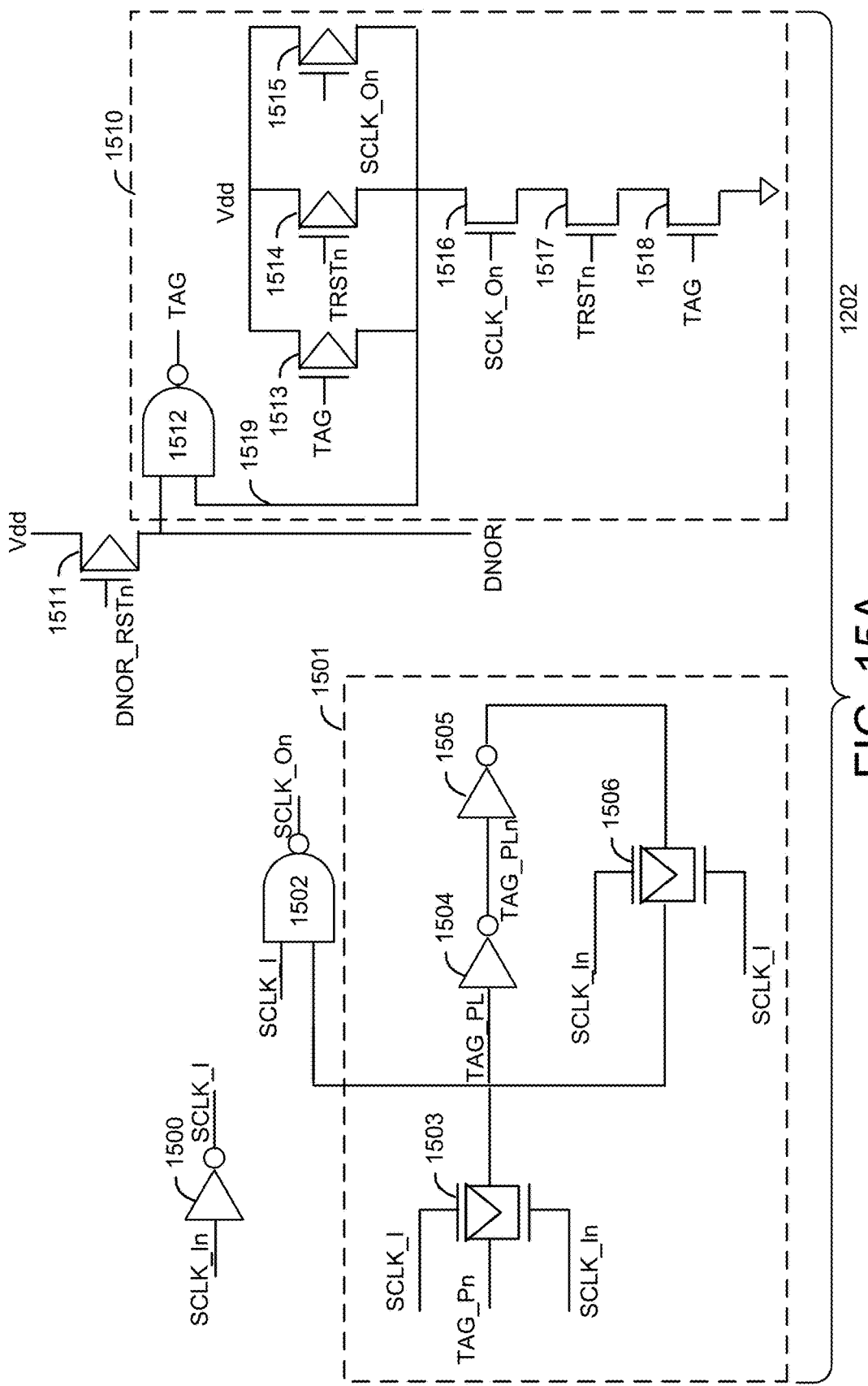
FIG. 15A depicts an example implementation of the tag circuit 1202 of FIG. 12.

FIG. 15A depicts an example implementation of the tag circuit 1202 of FIG. 12. An inverter 1500 inverts a clock signal SCLK In to provide an inverted clock signal SCLK_I. A level-sensitive latch 1501 can change its state when a clock signal is low. The latch includes transfer gates 1503 and 1506 and inverters 1504 and 1505. TAG_Pn is an input to the transfer gate 1503. An output of the transfer gate 1503, TAG_PL, is an input to a not AND (NAND) gate 1502 (a gating device), which receives SCLK_I as another input. SCLK_On is an output of the NAND gate, which serves to gate a clock signal. TAG_PLn is an output of the inverter 1504.

A set-reset latch 1510 is set to a state based on the bit value loaded in via DNOR. A NAND gate 1512 receives the bit value as one input and a voltage on a path 1519 as another input. A reset signal DNOR_RSTn can be used to provide a power supply voltage Vdd to the NAND gate via a pMOS transistor 1511 in a reset mode. The output of the NAND gate, TAG, will be low if the bit value is low (0), regardless of the voltage on the path 1519. When the bit value is high (1), the output of the NAND gate will be high or low if the voltage on the path 1519 is low or high, respectively.

TAG is provided to a pMOS transistor 1513 and an nMOS transistor 1518. A reset signal TRSTn is provided to a pMOS transistor 1514 and an nMOS transistor 1517. SCLK_On is provided to a pMOS transistor 1515 and an nMOS transistor 1516. When TAG, TRSTn and SCLK_On are all high, the path 1519 is grounded. When TAG, TRSTn and SCLK_On are all low, the path 1519 receives the high voltage of Vdd.

Thus, the clock signal SCLK_On is set high or low based on the tag input signal TAG_Pn in the latch, and SCLK_On and the bit value on DNOR set the output tag value TAG for the next tag circuit. SCLK_On is also passed to the next tag circuit in a group of tag circuits.

FIG. 15B depicts example waveforms associated with the circuit of FIG. 15A. The waveforms 1530, 1531, 1532, 1533, 1534 and 1535 depict SCLK_I, TAG_P, TAG_Pn, TAG_PL, SCLK_O and TAG, respectively. SCLK_I provides a periodic sequence of pulses 1530a-1530d. TAG_P can transition from high to low at the leading edge of the pulse 1530a. Similarly, due to the inversion, TAG_P can transition from low to high at the same time. TAG_PL can transition from high to low at the trailing edge of the pulse 1530a. Further, with SCLK_O having pulses 1534a-1534c, TAG can transition from high to low at the leading edge of the pulse 1534a which is also at the leading edge of the pulse 1530b.

FIG. 16 depicts an example implementation of the aggregation circuit 1121 of FIG. 11. It could also provide an implementation of any of the other aggregation circuits as well. For a bit count for an even-numbered group of bits, a NAND gate 1601 receives three inputs: ETAGn_SUM_pre, ETAGn<0> and ETAGn<1>, and provides an output net_etag_sum to an inverter 1602. An output of the inverter is ETAGn_SUM. For a bit count for an odd-numbered group of bits, a NAND gate 1604 receives three inputs: OTAGn_SUM_pre, OTAGn<0> and OTAGn<1>, and provides an output net_otag_sum to an inverter 1605. An output of the inverter is OTAGn_SUM.

The circuit 1610 includes top and bottom portions 1610a and 1610b, respectively, for processing bit counts for even and odd-numbered group of bits, respectively, in this example. In an implementation in which the separate even-odd bit counts are not used, one of the portions of the circuit can be omitted.

The top portion receives ETAGn_SUM_pre at an inverter 1611. ESHOT is a bias voltage of the inverters 1611 and 1613 and an input to a NAND gate 1614. A second input to the NAND gate is from an inverter 1612 which follows the inverter 1611. The output of the NAND gate, ESHOTn0 is provided to a buffer 1620 which in turn outputs ESHOTn<0> after a delay, and to an inverter 1621 and a not OR (NOR) gate 1625. A signal ETAGn<0> is provided to an inverter 1622. An output of the inverter 1622 is provided to an inverter 1623 whose output is provided to the NOR gate. The inverter 1622 is biased by an output of the inverters 1621 and 1624. Finally, an output of the NOR gate is provided to an inverter 1627 whose output is the signal ESHOTn<1>.

Similarly, the bottom portion receives OTAGn_SUM_pre at an inverter 1615. OSHOT is a bias voltage of the inverters 1615 and 1617 and an input to a NAND gate 1618. A second input to the NAND gate is from an inverter 1616 which follows the inverter 1615. The output of the NAND gate, OSHOTn0 is provided to a buffer 1619 which in turn outputs OSHOTn<0> after a delay, and to an inverter 1630 and a NOR gate 1632. A signal OTAGn<0> is provided to an inverter 1628. An output of the inverter 1628 is provided to an inverter 1629 whose output is provided to the NOR gate. The inverter 1628 is biased by an output of the inverters 1630 and 1631. Finally, an output of the NOR gate is provided to an inverter 1626 whose output is the signal OSHOTn<1>.

Figure 17A:
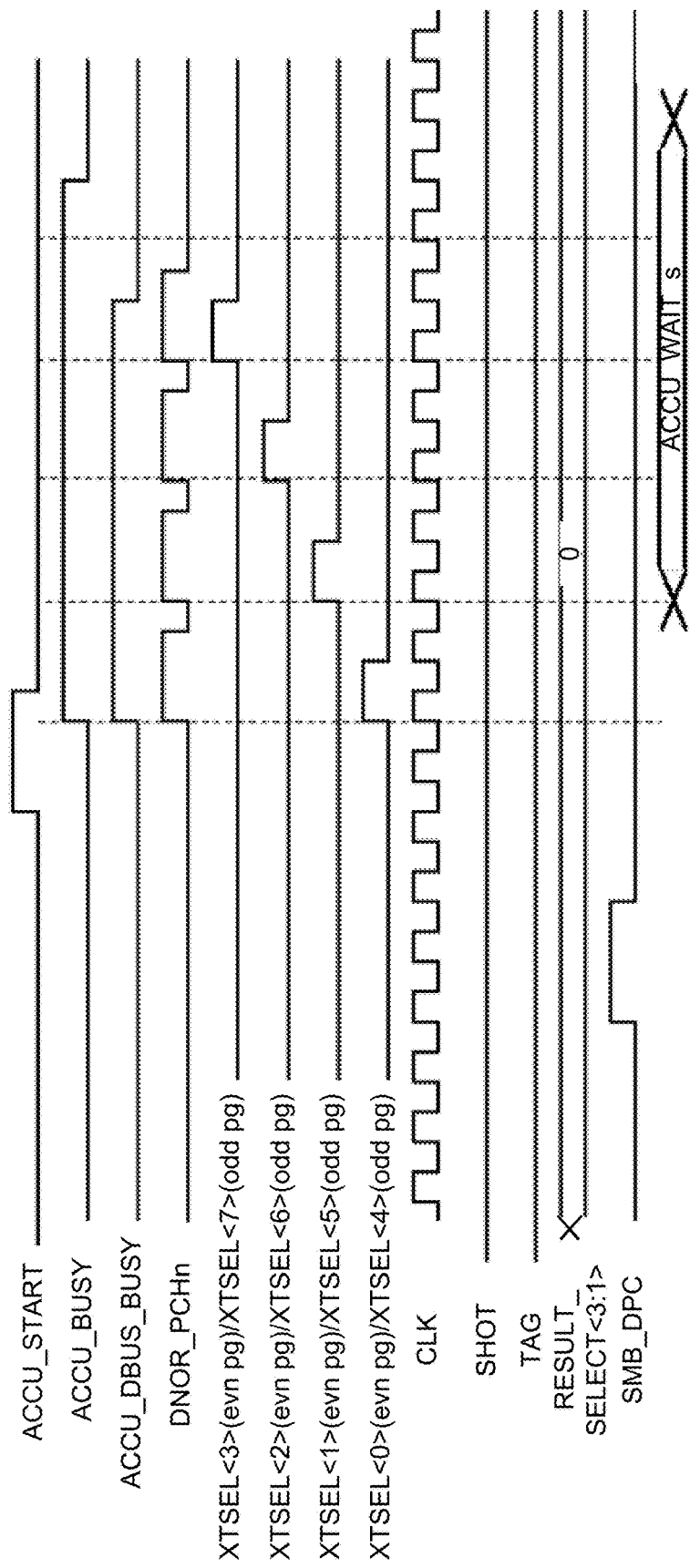
FIG. 17A depict example signals of the bit counting circuit 117 for the case of no fail bits present.

FIG. 17A depict example signals of the bit counting circuit 117 for the case of no fail bits present. ACCU_START denotes the accumulator starting. ACCU_BUSY is high when the accumulator is busy receiving bit count data from the aggregation circuits. ACCU_DBUS_BUSY is high when a data bus is busy. DNOR_PCHn goes high during bit loading into the tag circuits. XTSEL<3>(evn pg)/XTSEL<7>(odd pg) represents the select signal of FIG. 13 and denotes loading of an even-numbered bit from a path <3> and an odd-numbered bit from a path <7>(evn denotes even and pg denotes page). Similarly, XTSEL<2>(evn pg)/ XTSEL<6>(odd pg) denotes loading of an even-numbered bit from a path <2> and an odd-numbered bit from a path <6>, XTSEL<1>(evn pg)/XTSEL<5>(odd pg) denotes loading of an even-numbered bit from a path <1> and an odd-numbered bit from a path <5>, and XTSEL<0>(evn pg)/XTSEL<4>(odd pg) denotes loading of an even-numbered bit from a path <0> and an odd-numbered bit from a path <4>. Advantageously, each selection signal may use only two clock cycles.

Each time DNOR_PCHn goes high, bits are loaded using one of the XTSEL signals. CLK denotes a clock signal, which comprises a pulse train. SHOT denotes an input signal to a tag circuit such as in FIG. 12, and remains low when no fail bits are present. TAG denotes an input or output signal to a tag circuit or aggregation circuit, and remains low when no fail bits are present. RESULT_SELECT<3:1> denotes selecting a result. SMB_DPC denotes a signal which goes high temporarily before the bits are loaded. State<15:0> indicates when the accumulator is in a wait state.

Figure 17B:
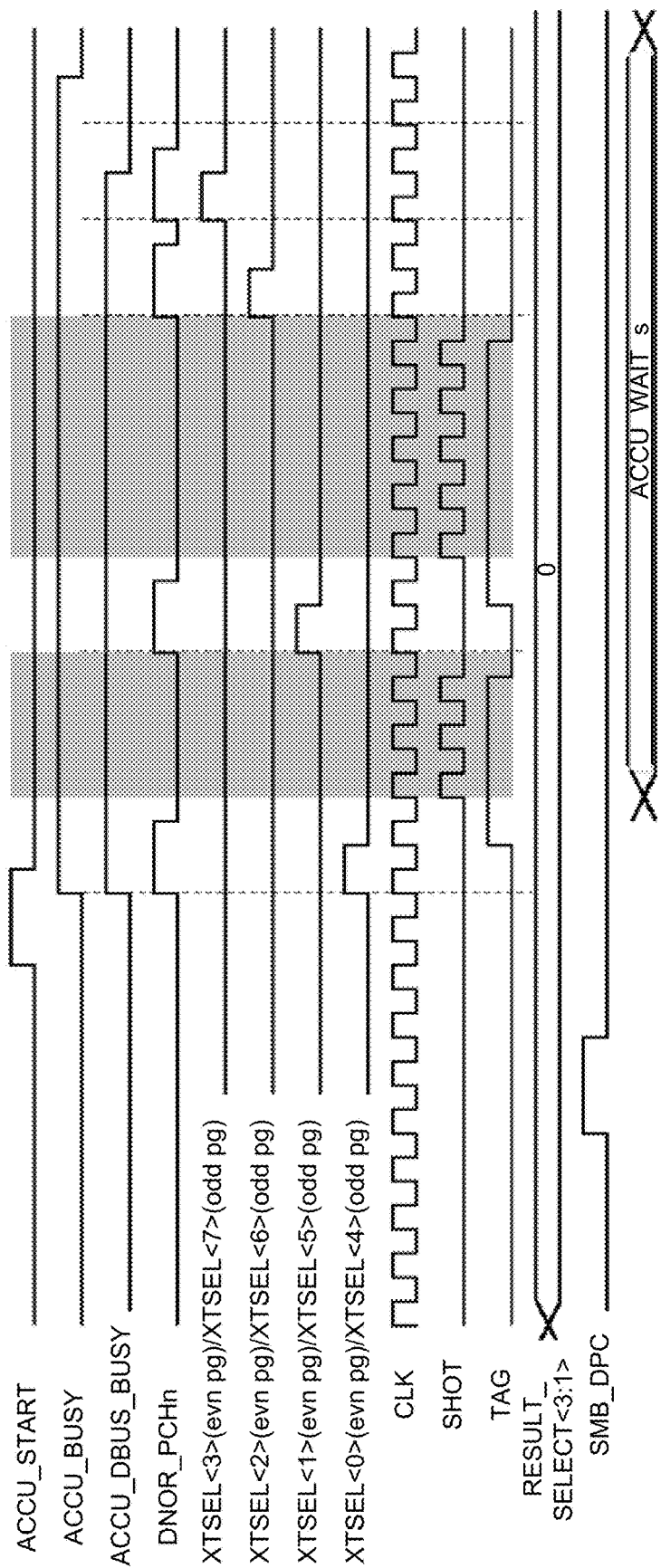
FIG. 17B depict example signals of the bit counting circuit 117 for the case of fail bits present.

FIG. 17B depict example signals of the bit counting circuit 117 for the case of fail bits present. ACCU_START is the same as in FIG. 17A. ACCU_BUSY and ACCU_DBUS_BUSY are high for a longer period that in FIG. 17A since additional time is needed to receive the bit count data. The second increase in DNOR_PCHn is delayed relative to the first increase due to the presence of fail bits. Similarly, the third increase in DNOR_PCHn is delayed relative to the second increase due to the presence of additional fail bits. Compared to FIG. 17A, the increase in XTSEL<1>(evn pg)/XTSEL<5>(odd pg) relative to XTSEL<0>(evn pg)/ XTSEL<4>(odd pg) is delayed as is the increase in XTSEL<2>(evn pg)/XTSEL<6>(odd pg) relative to XTSEL<1>(evn pg)/XTSEL<5>(odd pg).

Further, SHOT is elevated when fail bits are present, with three pulses and then with five pulses. TAG is also elevated when the fail bits are present.

If the TAG input is high, SHOT will be elevated and will continue as successive pulses until the return TAG is low. A daisy chain delay from when SHOT is sent until TAG goes low is important to reduce the clock period.

In one embodiment, an apparatus comprises: a plurality of sets of tag circuits (1001-1001b, 1010-1010b, 1011-1011b and 1012-1012b), each set of tag circuits is configured to receive input bits and output one or more signals which indicate a number of fail bits, the sets of tag circuits are configured to operate in parallel, and the tag circuits in each set are configured to operate serially; a plurality of sets of aggregation circuits (1003-1006, 1120, 1130, 1140, 1150, 1160, 1170, 1180 and 1190), the plurality of sets of aggregation circuits are configured to operate in parallel, and each set of aggregation circuits is configured to receive the signals which indicate the number of fail bits from multiple sets of tag circuits and to output a signal indicating a corresponding number of fail bits; and an accumulator (117) configured to count the fail bits based on the signals output from the plurality of sets of aggregation circuits.

In another embodiment, a method comprises: loading bits into a plurality of sets of tag circuits; in each set of tag circuits, detecting a number of fail bits and outputting one or more signals which indicate the number of fail bits; receiving the signals from the plurality of sets of tag circuits at aggregation circuits in a top level of a hierarchy, each aggregation circuit in the top level of the hierarchy receives signals from multiple respective sets of tag circuits and provides an output indicating a number of fail bits in the multiple respective sets of tag circuits; and receiving the signals from the aggregation circuits in the top level of the hierarchy at aggregation circuits in a next lower level of the hierarchy, each aggregation circuit in the next lower level of the hierarchy receives signals from multiple respective aggregation circuits in the top level of the hierarchy and provides an output indicating a number of fail bits aggregated by the multiple respective aggregation circuits in the top level of the hierarchy.

In another embodiment, an apparatus comprises: a plurality of means (e.g., tag circuits) for obtaining counts of bits having a specified value in a set of bits; a plurality of means for aggregating the counts (e.g., aggregation circuits), each means for aggregating is associated with multiple means for obtaining counts; and means for accumulating the counts (e.g., an accumulator), the means for accumulating is associated with each of the means for aggregating.

The plurality of means for aggregating may be arranged in at least a top level (L0) and a bottom level (L1) of a hierarchy.

In various embodiments, the means for obtaining the counts can include the tag circuits, control circuitry 110, sense blocks, or other logic hardware, and/or other executable code stored on a computer readable storage medium. Other embodiments may include similar or equivalent means for obtaining the counts.

In various embodiments, the means for aggregating the counts can include the aggregation circuits, control circuitry 110, or other logic hardware, and/or other executable code stored on a computer readable storage medium. Other embodiments may include similar or equivalent means for aggregating the counts.

In various embodiments, the means for accumulating the counts can include the accumulation circuit, control circuitry 110, or other logic hardware, and/or other executable code stored on a computer readable storage medium. Other embodiments may include similar or equivalent means for accumulating the counts.

Further, the plurality of means for aggregating may comprise, in the bottom level of the hierarchy, one means for aggregating (e.g., aggregation circuit 1103 or 1105) arranged serially before another means for aggregating (e.g., aggregation circuit 1104 or 1106, respectively); an output of the one means for aggregating is provided to an input of the another means for aggregating; an output of the another means for aggregating is provided to the means for accumulating; the one means for aggregating aggregates counts of bits from one number of the means for obtaining counts (e.g., 24 sets of tag circuits in FIG. 11); the another means for aggregating aggregates counts of bits from another number of the means for obtaining counts (e.g., 36 sets of tag circuits in FIG. 11); and the one number is less than the another number.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a plurality of sets of tag circuits, each set of tag circuits is configured to receive input bits and output one or more signals which indicate a number of fail bits, the sets of tag circuits are configured to operate in parallel, and the tag circuits in each set are configured to operate serially;
a plurality of aggregation circuits, the plurality of aggregation circuits comprises first sets of aggregation circuits configured to operate in parallel to receive the signals from the sets of tag circuits, in each of the first sets of aggregation circuits, a last aggregation circuit is configured to output a signal indicating a sum of fail bits for the set; and
an accumulator configured to count the fail bits based on signals output from the plurality of aggregation circuits.

2. The apparatus of claim 1, wherein:
each aggregation circuit is configured to receive signals which indicate the number of fail bits from multiple sets of tag circuits.

3. The apparatus of claim 1, wherein:
the plurality of aggregation circuits further comprise second sets of aggregation circuits configured to receive the signals indicating the sums of fails bits from the first sets of aggregation circuits; and
in each of the second sets of aggregation circuits, a last aggregation circuit is configured to output a signal indicating a sum of fail bits for the set.

4. The apparatus of claim 1, wherein:
each set of aggregation circuits in the first sets of aggregation circuits comprises multiple aggregation circuits which operate serially.

5. The apparatus of claim 3, wherein:
the second sets of aggregation circuits operate in parallel; and
each set of aggregation circuits in the second sets of aggregation circuits comprises multiple aggregation circuits which operate serially.

6. The apparatus of claim 3, wherein:
a number of aggregation circuits in the second sets of aggregation circuits is less than a number of aggregation circuits in the first sets of aggregation circuits.

7. The apparatus of claim 1, wherein:
each set of tag circuits operates according to clock cycles and the signal output by the set of tag circuits indicates the corresponding number of fail bits according to a number of clock cycles in which the signal output by the set of tag circuits is at a specified level.

8. The apparatus of claim 1, further comprising:
circuits for loading the bits into the plurality of sets of tag circuits in successive cycles, wherein the accumulator is configured to count the fail bits in each cycle.

9. The apparatus of claim 1, wherein:
the fail bits indicate a number of memory cells in a page of data which have not completed programming to an assigned data state in a program loop of a programming operation.

10. The apparatus of claim 1, wherein:
the input bits comprises even and odd-numbered groups of bits; and
each set of tag circuits is configured to receive input bits from the even and odd-numbered groups of bits and to provide the one or more signals which indicate the number of fail bits as a signal which indicates a number of fail bits in the even-numbered group of bits and a signal which indicates a number of fail bits in the odd-numbered group of bits.

11. The apparatus of claim 1, wherein in each set of tag circuits:

each tag circuit comprises a latch into which one of the bits is loaded, a gating device connected to the latch and configured to pass a clock signal when the one of the bits is a pass bit and block the clock signal when the one of the bits is a fail bit, and a set-reset latch configured to enter a set state when the one of the bits is the fail bit and to remain in a reset state when the one of the bits is the pass bit.

12. The apparatus of claim 11, wherein in each set of tag circuits:
   for each tag circuit before a last tag circuit, an output of the set-reset latch is connected to an input of a next tag circuit; and
   for the last tag circuit, an output of the set-reset latch is connected to one of the aggregation circuits.

* * * * *